United States Patent
Obara et al.

(10) Patent No.: US 11,211,531 B2
(45) Date of Patent: Dec. 28, 2021

(54) LIGHT-EMITTING DEVICE

(71) Applicant: PANASONIC SEMICONDUCTOR SOLUTIONS CO., LTD., Kyoto (JP)

(72) Inventors: Masami Obara, Kyoto (JP); Shigeo Hayashi, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/037,002

(22) Filed: Sep. 29, 2020

(65) Prior Publication Data

US 2021/0151643 A1    May 20, 2021

Related U.S. Application Data

(63) Continuation of application No. PCT/JP2020/014440, filed on Mar. 30, 2020.

(30) Foreign Application Priority Data

Nov. 14, 2019 (JP) .............................. JP2019-206153

(51) Int. Cl.
    *H01L 33/54*    (2010.01)
    *H01L 33/00*    (2010.01)
    (Continued)

(52) U.S. Cl.
    CPC .......... *H01L 33/54* (2013.01); *H01L 33/0095* (2013.01); *H01L 33/502* (2013.01);
    (Continued)

(58) Field of Classification Search
    CPC ....... H01L 33/54; H01L 33/502; H01L 33/60; H01L 33/501; H01L 33/50; H01L 33/56;
    (Continued)

(56) References Cited

U.S. PATENT DOCUMENTS

2010/0264438 A1  10/2010  Suenaga
2012/0104452 A1   5/2012  Miyoshi et al.
(Continued)

FOREIGN PATENT DOCUMENTS

EP   2436969 A2    4/2012
JP   2009-218274 A  9/2009
(Continued)

OTHER PUBLICATIONS

International Search Report and Written Opinion of the International Searching Authority dated Jun. 30, 2020 in International Patent Application No. PCT/JP2020/014440; with partial English translation.

*Primary Examiner* — Eva Y Montalvo
*Assistant Examiner* — Antonio B Crite
(74) *Attorney, Agent, or Firm* — McDermott Will and Emery LLP

(57) ABSTRACT

A light-emitting device includes: a mounting substrate including a mounting surface; a light-emitting element disposed on the mounting surface; a light transmissive component disposed on the light-emitting element; and a resin component that covers a side surface of the light-emitting element and a side surface of the light transmissive component. The resin component includes a cover portion that covers an outer edge portion of a topmost surface of the light transmissive component. A height from the mounting surface to a top of the cover portion is greater than a height from the mounting surface to the topmost surface of the light transmissive component. The topmost surface of the light transmissive component includes an exposed region that is exposed from the resin component. The cover portion is disposed continuously along one side of the light transmissive component.

21 Claims, 23 Drawing Sheets

(51) Int. Cl.
*H01L 33/50* (2010.01)
*H01L 33/56* (2010.01)
*H01L 33/62* (2010.01)
*H01L 33/60* (2010.01)
*H01L 33/58* (2010.01)

(52) U.S. Cl.
CPC .............. *H01L 33/56* (2013.01); *H01L 33/60* (2013.01); *H01L 33/62* (2013.01); *H01L 2933/005* (2013.01); *H01L 2933/0041* (2013.01); *H01L 2933/0058* (2013.01); *H01L 2933/0066* (2013.01)

(58) Field of Classification Search
CPC ....... H01L 33/504; H01L 33/62; H01L 33/58; H01L 2933/005
See application file for complete search history.

(56) References Cited

U.S. PATENT DOCUMENTS

| | | | |
|---|---|---|---|
| 2014/0131753 A1 | 5/2014 | Ishida et al. | |
| 2014/0203306 A1 | 7/2014 | Ito | |
| 2015/0102366 A1 | 4/2015 | Wada | |
| 2016/0181483 A1 | 6/2016 | Eichenberg et al. | |
| 2017/0155022 A1 | 6/2017 | Tomonari et al. | |
| 2017/0328525 A1 | 11/2017 | Herrmann et al. | |
| 2018/0138377 A1 | 5/2018 | Senuki et al. | |
| 2018/0351048 A1* | 12/2018 | Sogai | H01L 33/24 |
| 2019/0157249 A1* | 5/2019 | Nagel | H01L 33/005 |

FOREIGN PATENT DOCUMENTS

| | | |
|---|---|---|
| JP | 2010-272847 A | 12/2010 |
| JP | 4796031 B2 | 10/2011 |
| JP | 2012-081842 A | 4/2012 |
| JP | 2012-099544 A | 5/2012 |
| JP | 2014-112635 A | 6/2014 |
| JP | 2014-127679 A | 7/2014 |
| JP | 2014-143300 A | 8/2014 |
| JP | 2015-079805 A | 4/2015 |
| JP | 2016-532898 A | 10/2016 |
| JP | 2017-108091 A | 6/2017 |
| JP | 2017-152475 A | 8/2017 |
| JP | 2018-120959 A | 8/2018 |
| JP | 2018-160600 A | 10/2018 |
| JP | 2018-206819 A | 12/2018 |
| WO | 2017/013870 A1 | 1/2017 |

* cited by examiner (a)  (b) Luminance distribution

LIGHT-EMITTING DEVICE

CROSS REFERENCE TO RELATED APPLICATIONS

This is a continuation application of PCT International Application No. PCT/JP2020/014440 filed on Mar. 30, 2020, designating the United States of America, which is based on and claims priority of Japanese Patent Application No. 2019-206153 filed on Nov. 14, 2019. The entire disclosures of the above-identified applications, including the specifications, drawings and claims are incorporated herein by reference in their entirety.

FIELD

The present disclosure relates to a light-emitting device.

BACKGROUND

Conventionally, there is a light-emitting device including a light-emitting element, and a light transmissive component disposed on the light-emitting element (see PTL 1, for example).

The light-emitting device disclosed in PTL 1 includes: a light-emitting element; a first translucent component which is a light transmissive component disposed on the light-emitting element; a second translucent component which is a light transmissive component disposed on the first translucent component; and a light reflective component which encloses the light-emitting element, the first translucent component, and the second translucent component.

CITATION LIST

Patent Literature

PTL 1: Japanese Unexamined Patent Application Publication No. 2018-206819

SUMMARY

Technical Problem

However, in the light-emitting device disclosed in PTL 1, the second translucent component which is a light transmissive component is exposed upwardly, and thus the second translucent component is easily removed from the first translucent component and the light reflective component.

The present disclosure provides a light-emitting device that prevents a light transmissive component from being removed.

Solution to Problem

A light-emitting device according to an aspect of the present disclosure includes: a mounting substrate including a mounting surface; a light-emitting element disposed on the mounting surface; a light transmissive component disposed on the light-emitting element; and a resin component that covers a side surface of the light-emitting element and a side surface of the light transmissive component, in which the resin component includes a cover portion that covers an outer edge portion of a topmost surface of the light transmissive component, a height from the mounting surface to a top of the cover portion is greater than a height from the mounting surface to the topmost surface of the light transmissive component, and the topmost surface of the light transmissive component includes an exposed region that is exposed from the resin component.

Advantageous Effects

The light-emitting device according to an aspect of the present disclosure can prevent a light transmissive component from being removed.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
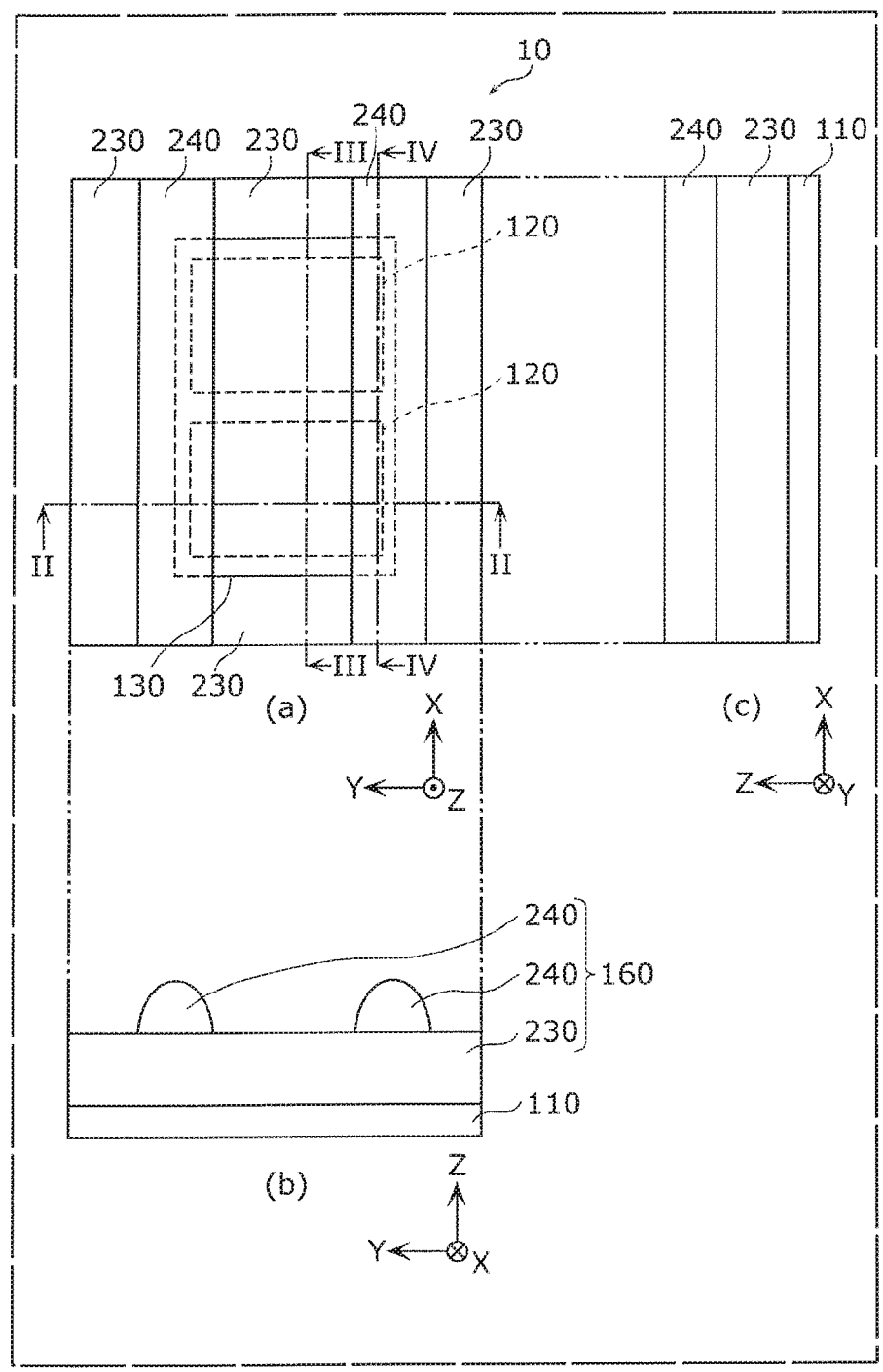
FIG. 1 is a diagram illustrating a light-emitting device according to embodiment 1.

The following describes embodiments according to the present disclosure with reference to the drawings. It should be noted that any one of the following embodiments shows a specific example of the present disclosure. The numerical values, shapes, materials, structural components, the arrangement and connection of the structural components, steps, the processing order of the steps, etc. shown in the following embodiments are mere examples, and thus are not intended to limit the present disclosure.

The figures are schematic illustrations and not necessarily precise illustrations. Accordingly, for example, the scale of each figure may be different. In the figures, substantially identical components are assigned the same reference signs, and overlapping descriptions thereof may be omitted or simplified.

Moreover, in the following embodiments, "substantially" referring to substantially the same is used. For example, substantially the same means not only completely the same but also virtually the same, i.e., for example, a difference of approximately a few percent is acceptable. The same is true of another expression which uses the "substantially". For example, a substantially trapezoidal shape may refer to a substantial trapezoid, and includes, for example, a trapezoidal shape with round corners. A simple expression such as a triangle or a trapezoid also refers to the same as the expression with "substantially" such as a substantially triangle shape or a substantially trapezoidal shape.

Moreover, in the following embodiments, terms of "above" and "bottom" do not refer to an upward direction (vertically upward) and a downward direction (vertically downward) in an absolute space recognition, respectively. The terms of "above" and "bottom" are also applied not only when two components are disposed at a distance from each other and another component is interposed therebetween, but also when two components are disposed in contact and connected with each other.

Moreover, in the following embodiments described below, a "top view" or "plan view" refers to the case where a mounting surface on which semiconductor elements are mounted is viewed from the normal direction of the mounting surface in a mounting substrate.

Moreover, in this Description and the drawings, the X-axis, the Y-axis, and the Z-axis represent the three axes in a three-dimensional orthogonal coordinate system. In each embodiment, the Z-axis direction is a vertical direction, and a direction perpendicular to the Z-axis (i.e., a direction parallel to the XY plane) is a horizontal direction. It should be noted that the positive direction of the Z-axis is directed vertically upward. Moreover, in this Description, a "thickness direction" refers to the thickness direction of a light-emitting device, and in the following embodiments, the thickness direction is described as the Z-axis direction.

Embodiment 1

(Configuration)

Firstly, the configuration of a light-emitting device according to embodiment 1 will be described with reference to FIG. 1 through FIG. 4.

Figure 2:
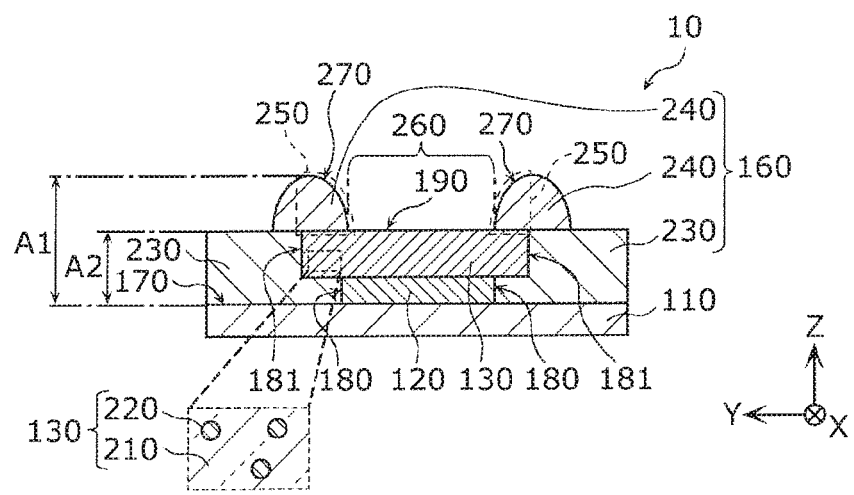
FIG. 2 is a sectional view of the light-emitting device according to embodiment 1 along the line II-II in FIG. 1.
Figure 3:
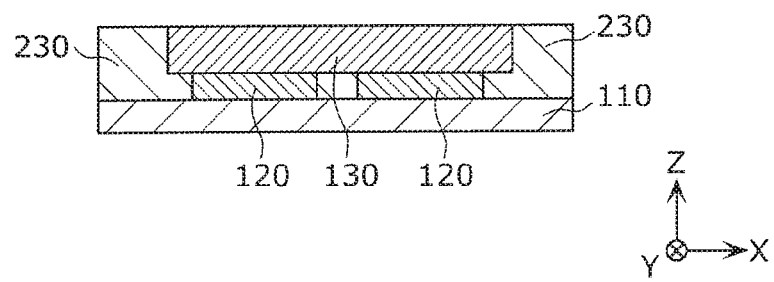
FIG. 3 is a sectional view of the light-emitting device according to embodiment 1 along the line III-III in FIG. 1.
Figure 4:
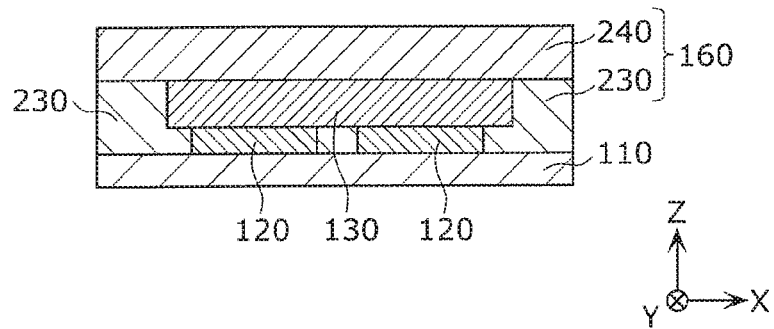
FIG. 4 is a sectional view of the light-emitting device according to embodiment 1 along the line IV-IV in FIG. 1.

FIG. 1 is a diagram illustrating light-emitting device 10 according to embodiment 1. It should be noted that (a) in FIG. 1 is a top view, (b) in FIG. 1 is a side view from the X-axis direction, and (c) in FIG. 1 is a side view from the Y-axis direction. FIG. 2 is a sectional view of light-emitting device 10 according to embodiment 1 along the line II-II in FIG. 1. FIG. 3 is a sectional view of light-emitting device 10 according to embodiment 1 along the line III-III in FIG. 1. FIG. 4 is a sectional view of light-emitting device 10 according to embodiment 1 along the line IV-IV in FIG. 1.

Light-emitting device 10 is an optical device that emits light.

As shown in FIG. 1 through FIG. 4, light-emitting device 10 includes mounting substrate 110, light-emitting elements 120, light transmissive component 130, and resin component 160.

Mounting substrate 110 is a substrate with mounting surface 170 on which light-emitting elements 120 are disposed (mounted). In this embodiment, light-emitting elements 120 are flip-chip bonded to (flip-chip mounted on) mounting surface 170. On mounting surface 170, for example, wirings electrically connected to light-emitting elements 120 are formed.

The material of mounting substrate 110 is not particularly limited. For example, a metal, a ceramic, or a resin is possible.

In this embodiment, mounting substrate 110 is rectangular-shaped in the top view. Mounting substrate 110 may be polygon-shaped or circular-shaped in the top view, and the shape is not particularly limited.

Each of light-emitting elements 120 is a semiconductor element that is disposed on mounting surface 170 and emits light. Light-emitting element 120 is a light-emitting element such as a light emitting diode (LED), for example. Light-emitting element 120 is formed using a material such as gallium nitride (GaN).

It should be noted that in this embodiment, light-emitting device 10 includes two light-emitting elements 120, but the number of light-emitting elements 120 in light-emitting device 10 is not limited. Light-emitting device 10 may include one light-emitting element 120, or three or more light-emitting elements 120. For example, light-emitting device 10 includes multiple light-emitting elements 120, and multiple light-emitting elements 120 are disposed between light transmissive component 130 and mounting substrate 110.

Light transmissive component 130 is disposed on light-emitting elements 120 and transmits light emitted by light-emitting element 120. In this embodiment, light transmissive component 130 is rectangular plate-shaped in the top view.

Moreover, light transmissive component 130 is bonded to the top surface (a surface on the positive side of the Z-axis) of light-emitting element 120. It should be noted that the size, number, shape, and the like of light transmissive component 130 in light-emitting device 10 are not particularly limited. When the outer peripheral size of light transmissive component 130 is different from the outer peripheral size of light-emitting element 120, the contour of light transmissive component 130 and the contour of light-emitting element 120 may be made continuous by disposing a transparent resin not only between light transmissive component 130 and light-emitting element 120 but also on the side surface of light-emitting element 120 to form a light guide structure.

Moreover, in this embodiment, light transmissive component 130 contains phosphor 220 that emit fluorescence light using light emitted by light-emitting element 120 as excitation light. More specifically, light transmissive component 130 includes binder 210 and phosphor 220, for example.

Binder 210 is a component for holding phosphor 220. Binder 210 is a light transmissive resin, a ceramic, or a glass, for example. For example, binder 210 is rectangular plate-shaped in the top view. Moreover, binder 210 includes dispersed phosphor 220.

Phosphor 220 receives light emitted by light-emitting element 120, convert the light into light having a different wavelength, and emit the converted light. For example, light-emitting element 120 emits blue light. In this case, for example, phosphor 220 emits fluorescence light such as wavelength-converted green, yellow, or red light using the blue light emitted by light-emitting element 120 as excitation light.

The material of phosphor 220 is not particularly limited. YAG ($Y_3Al_5O_{12}$) yellow phosphor, CASN ($CaAlSiN_3$) red phosphor, or SiAlON green phosphor are taken as an example of the material of phosphor 220. Light transmissive component 130 includes phosphor 220 dispersed in binder 210 such as a resin, a ceramic, or a glass.

In this embodiment, light-emitting element 120 emits blue light. Moreover, in this embodiment, light transmissive component 130 (more specifically, phosphor 220 contained in light transmissive component 130) emits yellow light (yellow fluorescence light) using the blue light emitted by light-emitting element 120 as excitation light.

Moreover, topmost surface 190 of light transmissive component 130 has exposed region 260 that is exposed from resin component 160. In other words, exposed region 260, which is not covered by resin component 160, is formed in topmost surface 190 of light transmissive component 130. The light emitted by light-emitting element 120 and the light emitted by phosphor 220 exit through exposed region 260 to the outside of light transmissive component 130 (i.e., the outside of light-emitting device 10)

Resin component 160 surrounds light-emitting elements 120 and light transmissive component 130. In particular, resin component 160 is disposed in contact with light-emitting elements 120 and light transmissive component 130. More specifically, resin component 160 is disposed on mounting surface 170 to cover side surface 180 of light-emitting element 120 and side surface 181 of light transmissive component 130.

An electrically insulating resin such as a silicone resin or an epoxy resin is taken as an example of resin component 160.

Moreover, in this embodiment, light reflective material particles are added to resin component 160. For example, resin component 160 includes a silicone resin or an epoxy resin as a base material in which the light reflective material particles are dispersed. In this manner, resin component 160 may be of a light reflective material (i.e., a light reflective component that reflects light emitted by light-emitting element 120 and light transmissive component 130).

For example, resin component 160 has higher hardness in cover portion 250 than in a portion covering side surfaces 180 and 181. For example, cover portion 250 includes more $SiO_2$ particles (thickener) each having a diameter of nanometer order than a region other than cover portion 250 in resin component 160. The hardness of resin component 160 increases as $SiO_2$ particles (nano-particles) contained therein increases. With this, when the temple-bell-shaped structure (outwardly curved surface 270) of cover portion 250 is formed by applying a resin, the deformation of the shape can be reduced.

Moreover, for example, cover portion 250 has a width (a length in the direction orthogonal to the extension direction of protrusion 240 in the top view) that decreases as the distance from the maximum width position increases in the positive direction of the Z-axis. The thickener is added to a resin for forming cover portion 250 to prevent the deformation, and a resin for forming protrusion 240 is applied under high temperature conditions of approximately 150 degrees C. Due to the high temperature conditions, the surface of the resin is semi-cured and bonded to a base, and thus it is possible to prevent the bottom portion of the resin from extending in the width direction on the bonding surface between the base and the resin.

Titanium oxide ($TiO_2$) or zinc oxide (ZnO) is taken as an example of the light reflective material. For example, resin component 160 including the light reflective material is formed by curing a liquid silicone resin containing $TiO_2$ particles and a dispersant such as $SiO_2$.

With this, resin component 160 has the electrical insulation properties and the light reflectivity. Resin component 160 has the light reflectivity, and thus light emitted from the bottom and side of light-emitting element 120 is reflected by the light reflective material and exits upwardly from light-emitting device 10.

Resin component 160 includes peripheral portion 230 and protrusion 240.

Peripheral portion 230 is a part of resin component 160 disposed on mounting surface 170 in contact with side surface 180 of light-emitting element 120 and side surface 181 of light transmissive component 130.

Protrusion 240 is a part of resin component 160 disposed to protrude from peripheral portion 230 toward a point above topmost surface 190 of light transmissive component 130. In this embodiment, protrusion 240 is linearly extended in the top view. The both ends of protrusion 240 in the X-axis direction (the lengthwise direction) are each aligned with the outer end of peripheral portion 230 in the top view. In other words, the both ends of protrusion 240 in the lengthwise direction are also each aligned with the outer end of light-emitting device 10. Moreover, in this embodiment, protrusion 240 is substantially semicircular-shaped in the sectional view.

Protrusion 240 has cover portion 250 that covers the outer edge portion of topmost surface 190 of light transmissive component 130. In other words, cover portion 250 covers the outer edge portion of light transmissive component 130.

Here, height A1 from mounting surface 170 to the top of cover portion 250 is greater than height A2 from mounting surface 170 to topmost surface 190 of light transmissive component 130. In this embodiment, the top of cover portion 250 is the top of protrusion 240. Moreover, in this embodiment, topmost surface 190 is the top surface of light transmissive component 130.

It should be noted that topmost surface 190 refers to a surface located at the furthest distance from mounting surface 170 in the normal direction of mounting surface 170. For example, when topmost surface 190 is not parallel to but inclined with respect to mounting surface 170 (not shown), the position indicated by topmost surface 190 indicates a position located at the furthest distance from mounting surface 170 in the normal direction of mounting surface 170 in light transmissive component 130.

For example, cover portion 250 covers at least 5% of the area of topmost surface 190 of light transmissive component 130. Cover portion 250 may cover at least 10% of the area of topmost surface 190 of light transmissive component 130. Alternatively, for example, cover portion 250 covers at most 25% of the area of topmost surface 190 of light transmissive component 130. It should be noted that cover portion 250 may cover a part or the entirety of the outer edge portion of light transmissive component 130.

Moreover, for example, in the sectional view, the width (in this embodiment, the length in the Y-axis direction) of light transmissive component 130 covered by cover portion 250 on topmost surface 190 of light transmissive component 130 is at least 5% of the width of topmost surface 190 of light transmissive component 130.

Moreover, in this embodiment, cover portion 250 has outwardly curved surface 270 located close to exposed region 260. In other words, cover portion 250 has outwardly curved surface 270 which is the exposed surface curved outwardly toward exposed region 260. In this embodiment, the entire exposed surface of cover portion 250 is curved outwardly toward exposed region 260.

In this embodiment, protrusion 240 has the shape of a straight line extending in one direction in the top view, and projects upwardly. In other words, cover portion 250 is linearly extended in the top view. For example, cover portion 250 is a part of the projected portion (in this embodiment, protrusion 240) disposed on light transmissive component 130. Moreover, for example, the width (the length in the direction orthogonal to the extension direction of protrusion 240 in the top view) of the projected portion (in this embodiment, protrusion 240) is constant throughout cover portion 250 extending linearly in the top view.

It should be noted that the "constant" described here means that not only the width is completely the same but also a difference of approximately a few percent (e.g., 10%) is acceptable. For example, in the case where the average width of protrusion 240 is 200 μm, the width of protrusion 240 is regarded as constant if it is at least 180 μm and at most 220 μm in the linear portion. The same is true of cover portion 250.

[Light Emission]

Next, how to emit light from light-emitting device 10 will be described with reference to FIG. 5 and FIG. 6.

Figure 5:
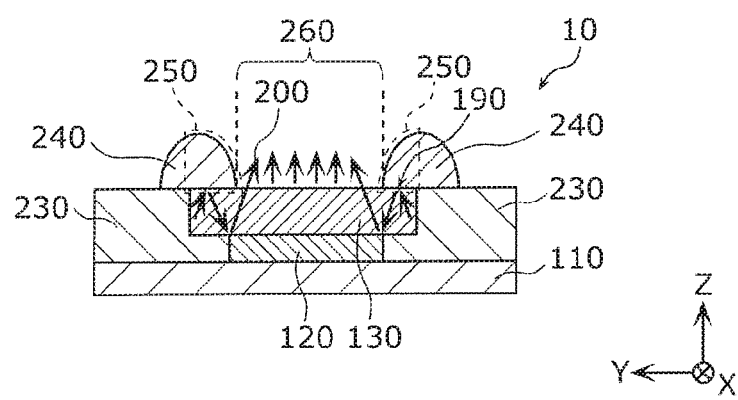
FIG. 5 is a sectional view illustrating how light is emitted from the light-emitting device according to embodiment 1.

FIG. 5 is a sectional view illustrating how light (emitted light 200) is emitted from light-emitting device 10 according to embodiment 1. FIG. 6 is the sectional view illustrating how light (emitted light 2000) is emitted from light-emitting device 1000 according to a comparison example. It should be noted that the sectional views shown in FIG. 5 and FIG. 6 correspond to the sectional view of FIG. 2.

Light-emitting device 1000 according to the comparison example differs from light-emitting device 10 in that protrusion 240 is not included.

As shown in FIG. 5, a part of emitted light 200 emitted from light-emitting element 120 and phosphor 220 in light transmissive component 130 is reflected by peripheral portion 230 and protrusion 240, and exits through exposed region 260.

Figure 6:
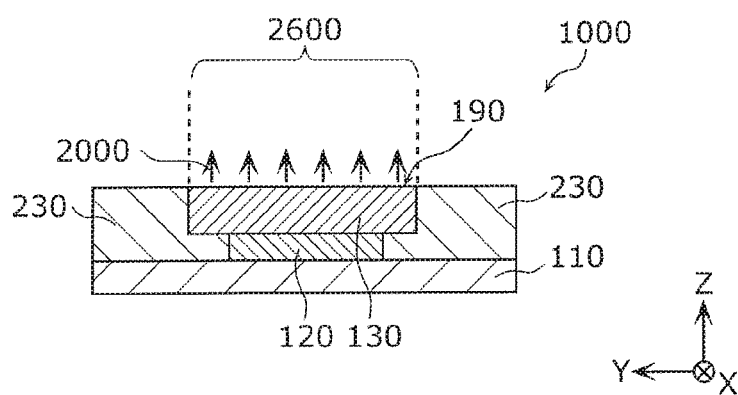
FIG. 6 is a sectional view illustrating how light is emitted from a light-emitting device according to a comparison example.

On the other hand, as shown in FIG. 6, a part of emitted light 2000 emitted from light-emitting element 120 and phosphor 220 in light transmissive component 130 exits through exposed region 2600 without being reflected by protrusion 240.

The light reflectance of peripheral portion 230 and protrusion 240 is approximately 97%, for example. Accordingly, the amount of light emitted by light-emitting device 10 is substantially the same as that of light-emitting device 1000.

Here, unlike light-emitting device 1000, in light-emitting device 10, the outer edge portion of the top surface (topmost surface 190) of light transmissive component 130 is covered by protrusion 240 (more specifically, cover portion 250) included in resin component 160. Accordingly, the area of exposed region 260 of light-emitting device 10 is smaller than the area of exposed region 2600 of light-emitting device 1000 in the top view. With this, light-emitting device 10 emits light having a higher luminance than light-emitting device 1000.

[Advantageous Effects, Etc.]

As described above, light-emitting device 10 according to embodiment 1 includes: mounting substrate 110 including mounting surface 170; light-emitting element 120 disposed on mounting surface 170; light transmissive component 130 disposed on light-emitting element 120; and resin component 160 that covers side surface 180 of light-emitting element 120 and side surface 181 of light transmissive component 130. Resin component 160 includes cover portion 250 that covers an outer edge portion of topmost surface 190 of light transmissive component 130. Height A1 from mounting surface 170 to a top of cover portion 250 is greater than height A2 from mounting surface 170 to topmost surface 190 of light transmissive component 130. Topmost surface 190 of light transmissive component 130 includes exposed region 260 that is exposed from resin component 160.

With this, topmost surface 190 of light transmissive component 130 is supported by resin component 160 (more specifically, protrusion 240). Accordingly, in light-emitting device 10, light transmissive component 130 is prevented from being removed.

Moreover, for example, cover portion 250 covers at least 5% of the area of topmost surface 190 of light transmissive component 130.

As a result of the earnest study of the inventors, it is found that especially, when cover portion 250 covers at least 5% of the area of topmost surface 190 of light transmissive component 130, light transmissive component 130 is prevented from being removed. Accordingly, cover portion 250 covers at least 5% of the area of topmost surface 190 of light transmissive component 130, and thus light transmissive component 130 is further prevented from being removed.

Moreover, for example, resin component 160 is a reflective material. Moreover, for example, cover portion 250 has outwardly curved surface 270 located close to exposed region 260.

In this manner, the surface of cover portion 250 is not flatten, and thus light emitted by light-emitting device 10 is less likely to be directed to a specific direction. Accordingly, glare is reduced.

Moreover, for example, cover portion 250 is a part of the projected portion disposed on light transmissive component 130. Moreover, for example, the width (the length in the direction orthogonal to the longitudinal direction of protrusion 240 in the top view) of the projected portion is constant throughout cover portion 250 extending linearly in the top view.

With this, for example, cover portion 250 can be easily formed using a dispensing method.

[Variation]

The following describes a light-emitting device according to a variation of embodiment 1.

It should be noted that the following description of the variation focuses on differences from embodiment 1. The components substantially identical to those of light-emitting device 10 according to embodiment 1 are assigned the same reference signs, and overlapping descriptions thereof may be omitted or simplified.

<Variation 1>

Figure 7:
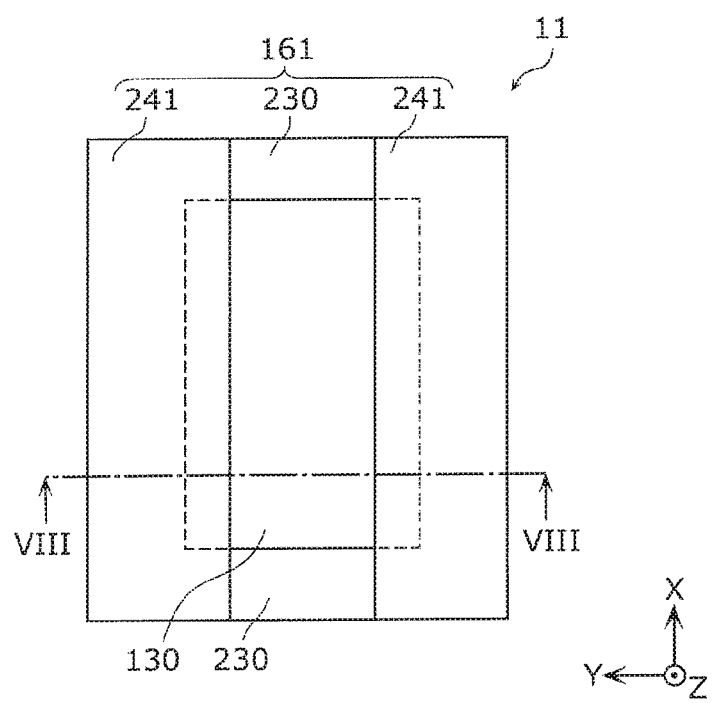
FIG. 7 is a top view of a light-emitting device according to variation 1 of embodiment 1.
Figure 8:
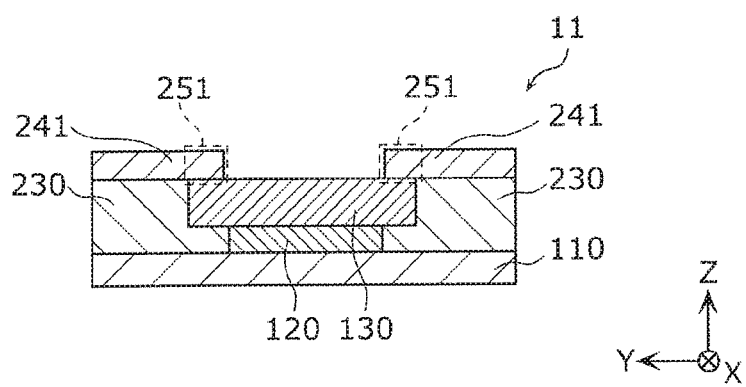
FIG. 8 is a sectional view of the light-emitting device according to variation 1 of embodiment 1 along the line VIII-VIII in FIG. 7.

FIG. 7 is a top view of light-emitting device 11 according to variation 1. FIG. 8 is a sectional view of light-emitting device 11 according to variation 1 along the line VIII-VIII in FIG. 7.

Light-emitting device 11 includes resin component 161 different from that of light-emitting device 10. More specifically, resin component 161 includes protrusion 241 different from that of resin component 160. Resin component 161 has peripheral portion 230 that covers the side surface of light-emitting element 120 and the side surface of light transmissive component 130, and protrusion 241 that protrudes upwardly from peripheral portion 230 and includes cover portion 251. The end of protrusion 241 is aligned with the outer end of peripheral portion 230. More specifically, three sides of each of two protrusions 241 disposed to sandwich exposed region 260 of light transmissive component 130 therebetween are each aligned with the outer end of peripheral portion 230 in the top view. In other words, each of two protrusions 241 has three sides each aligned with the outer end of light-emitting device 11 in the top view.

In other words, protrusion 241 includes cover portion 251 that covers the outer edge portion of light transmissive component 130. Here, unlike cover portion 250, cover portion 251 does not have outwardly curved surface 270. In this manner, cover portion 251 need not have outwardly curved surface 270. Moreover, cover portion 251 is rectangular-shaped in the top view. In this manner, the shape of cover portion 251 in the top view is not particularly limited.

<Variation 2>

Figure 9:
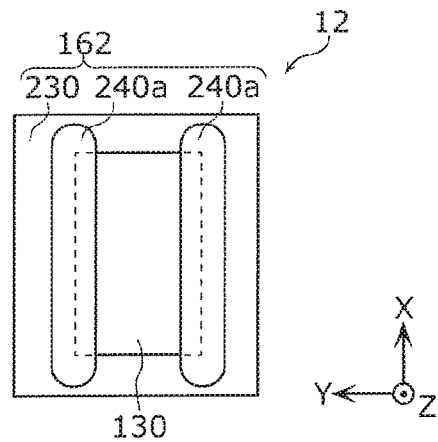
FIG. 9 is a top view of a light-emitting device according to variation 2 of embodiment 1.

FIG. 9 is a top view of light-emitting device 12 according to variation 2.

Protrusion 240a included in resin component 162 in light-emitting device 12 is not extended to the both ends of peripheral portion 230 in the X-axis direction, and is disposed inside apart from the outer end of peripheral portion 230, in the top view. In other words, protrusion 240a is disposed inward of the outer periphery (the outer end) of light-emitting device 12. In this manner, the lengthwise length of cover portion 240a is not particularly limited.

<Variation 3>

Figure 10:
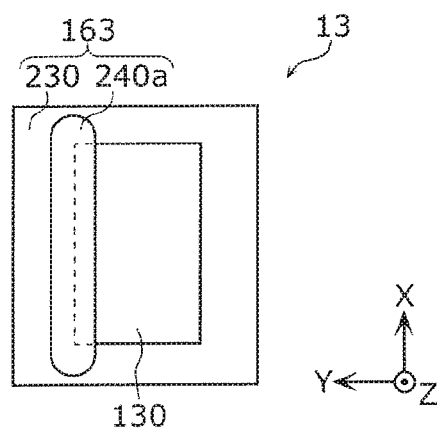
FIG. 10 is a top view of a light-emitting device according to variation 3 of embodiment 1.

FIG. 10 is a top view of light-emitting device 13 according to variation 3.

Protrusion 240a included in resin component 163 in light-emitting device 13 is disposed only on one side of light transmissive component 130 in the Y-axis direction, i.e., is disposed to overlap with only one edge of the outer edge portion of light transmissive component 130 along the lengthwise direction. In this manner, protrusion 240a may be formed to overlap with the outer edge portion of light transmissive component 130 at least at one edge of the outer edge portion in the top view, i.e., to cover at least a part of the outer edge portion of light transmissive component 130.

<Variation 4>

Figure 11:
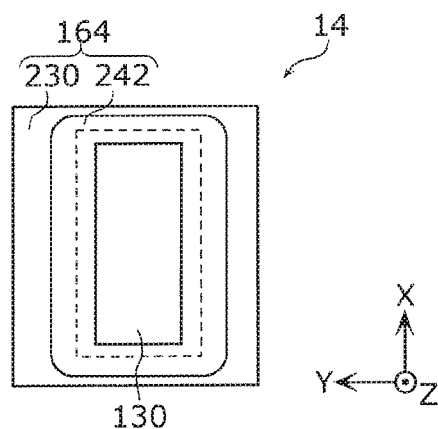
FIG. 11 is a top view of a light-emitting device according to variation 4 of embodiment 1.

FIG. 11 is a top view of light-emitting device 14 according to variation 4.

Protrusion 242 included in resin component 164 in light-emitting device 14 is annularly formed to cover the entire outer edge portion of light transmissive component 130. In this manner, protrusion 242 may cover the entire outer edge portion of light transmissive component 130.

<Variation 5>

Figure 12:
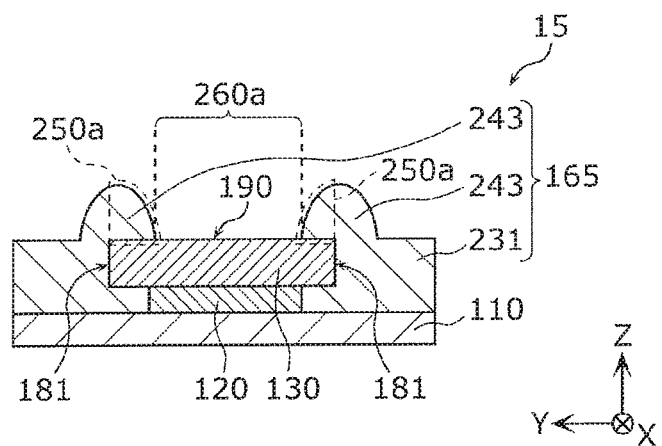
FIG. 12 is a sectional view of a light-emitting device according to variation 5 of embodiment 1.

FIG. 12 is a sectional view of light-emitting device 15 according to variation 5. It should be noted that FIG. 12 corresponds to the sectional view along the line II-II in FIG. 1.

Resin component 165 in light-emitting device 15 includes peripheral portion 231 and protrusion 243.

Here, peripheral portion 231 and protrusion 243 are integrally formed. More specifically, in resin component 165, a part covering side surface 181 of light transmissive component 130 (i.e., peripheral portion 231) and cover portion 250a are integrally formed.

With this, cover portion 250a is less likely to be removed from peripheral portion 231. Accordingly, light transmissive component 130 is further prevented from being removed from resin component 165.

For example, peripheral portion 231 and cover portion 250a are formed without a bond interface between peripheral portion 231 and cover portion 250a by simultaneously curing a liquid resin for peripheral portion 231 and a liquid resin for cover portion 250a. In such a manner, peripheral portion 231 and cover portion 250a are integrally formed. The resin for peripheral portion 231 and the resin for cover portion 250a may be the same (e.g., silicone resin).

For example, the liquid resin for protrusion 243 is applied and cured before the liquid resin for peripheral portion 231 is fully cured.

Alternatively, mask 400 (e.g., see FIG. 37) is disposed in a region where exposed region 260a is to be formed in light transmissive component 130, and the liquid resin for resin component 165 may be filled beyond topmost surface 190 of light transmissive component 130 and cured. With this, it is possible to form exposed region 260a and integrally from peripheral portion 231 and protrusion 243.

<Variation 6>

Figure 13:
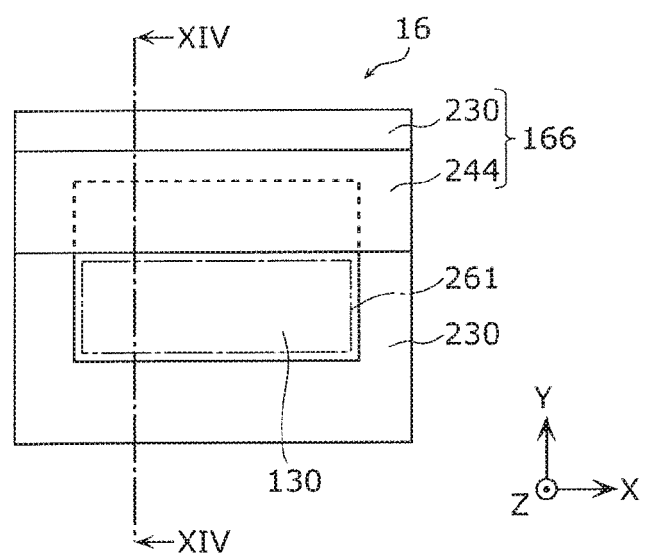
FIG. 13 is a top view of a light-emitting device according to variation 6 of embodiment 1.
Figure 14:
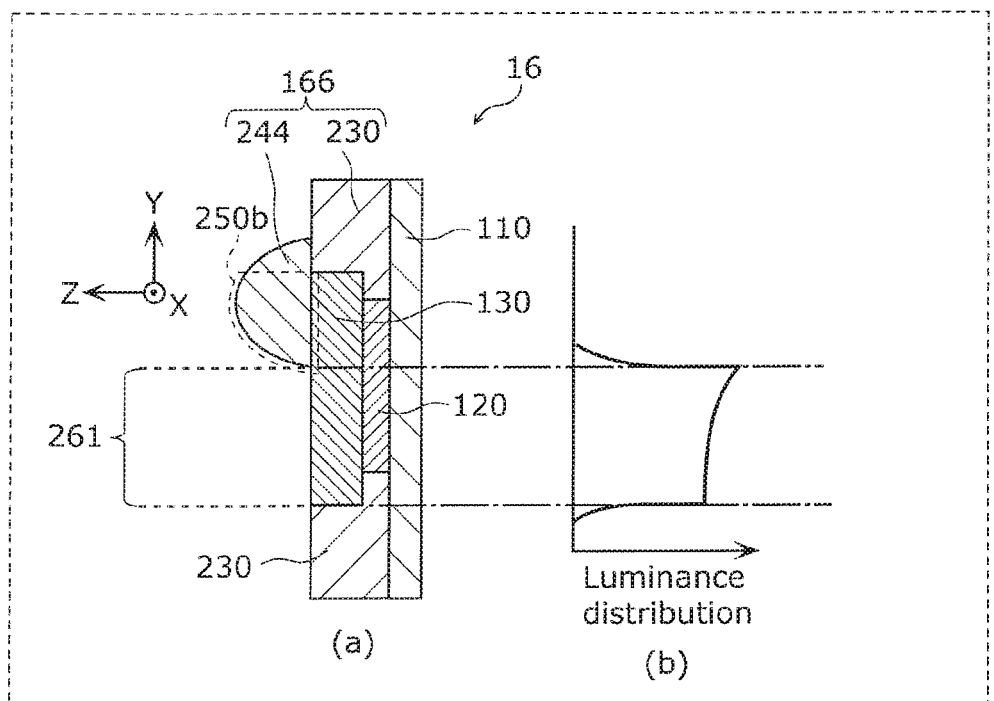
FIG. 14 is a sectional view of the light-emitting device according to variation 6 of embodiment 1 along the line XIV-XIV in FIG. 13.

FIG. 13 is a top view of light-emitting device 16 according to variation 6. FIG. 14 is the sectional view of light-emitting device 16 according to variation 6 along the line XIV-XIV in FIG. 13. It should be noted that (a) of FIG. 14 illustrates the sectional view of light-emitting device 16 according to variation 6 and (b) of FIG. 14 illustrates the luminance distribution of light-emitting device 16 according to variation 6 (more specifically, exposed region 261).

Cover portion 250b which is a part of protrusion 244 included in resin component 166 in light-emitting device 16 covers only one side of light transmissive component 130 which is rectangular-shaped in the top view. More specifically, cover portion 250b is disposed continuously along one side of light transmissive component 130. Moreover, protrusion 244 is extended to the both ends of peripheral portion 230 in the X-axis direction in the top view.

Cover portion 250b covers only one side of light transmissive component 130 which is rectangular-shaped in the top view, and thus as shown in (b) of FIG. 14, more light reflected by reflective resin component 244 exits through exposed region 261 at a position closer to resin component 244 after repeating the reflection several times since light transmissive component 130 is thin in the thickness direction (in the Z-axis direction). Accordingly, the luminance increases as the distance to cover portion 250b decreases in exposed region 261. More specifically, in exposed region 261, the slope of the luminance distribution in the direction vertical to cover portion 250b disposed continuously along one side of light transmissive component 130 changes such that the luminance increases as the distance to cover portion 250b decreases. With this, light-emitting device 16 is especially useful as a light source of a headlight of a vehicle, for example.

For example, a low beam of the headlight illuminates an area farther ahead of the vehicle as the light is emitted from the upper side of the headlight. Accordingly, a light source that emits the low beam is desired to have a luminance increasing as the distance to the upper side decreases.

Moreover, in a direct-lense lighting device, the shape of exposed region 261 and the shape of a spot of illumination light emitted from the lighting device (the shape of a light beam illuminating a plane orthogonal to the optical axis) are similar.

In view of above, light-emitting device 16 is especially appropriate to the light source that emits the low beam of the headlight.

Figure 15:
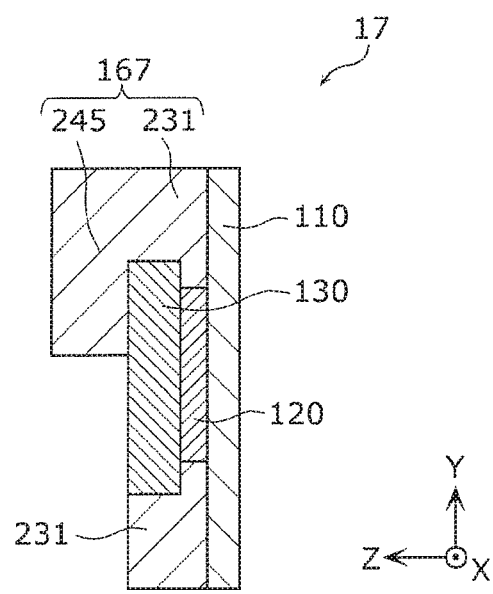
FIG. 15 is a sectional view of a light-emitting device according to another example of variation 6 of embodiment 1.

FIG. 15 is a sectional view of light-emitting device 17 according to another example of variation 6. It should be noted that FIG. 15 corresponds to the sectional view along the line XIV-XIV in FIG. 13.

Like resin component 165 in light-emitting device 15, peripheral portion 231 and protrusion 245 included in resin component 167 in light-emitting device 17 are integrally formed. Moreover, like protrusion 241 in light-emitting device 11 shown in FIG. 8, protrusion 245 is plate-shaped. In this manner, light-emitting device 17 may be implemented by combining any of the distinctive configurations according to each embodiment and each variation.

<Variation 7>

Figure 16:
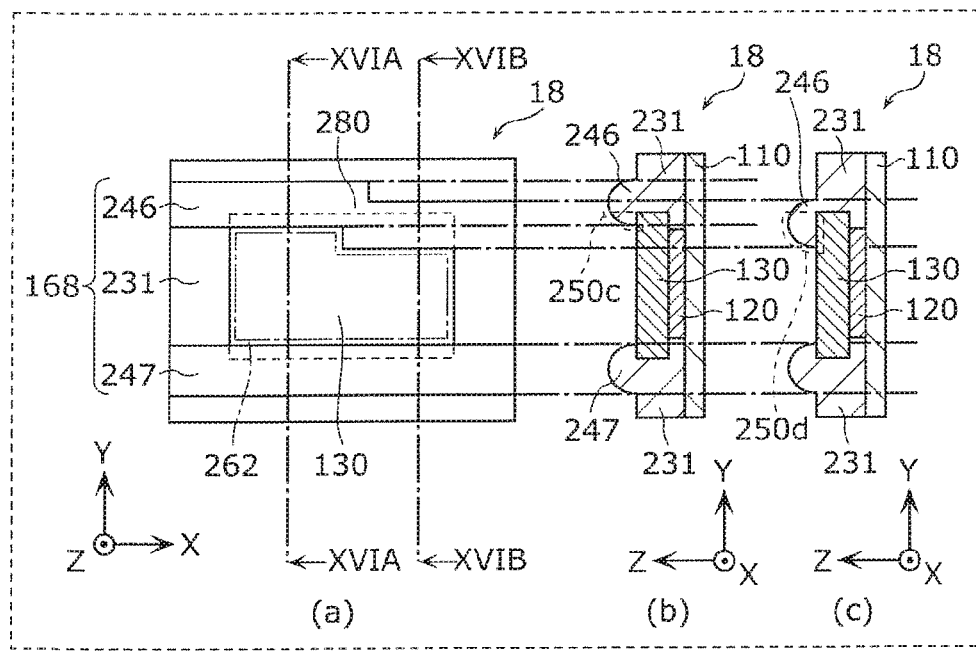
FIG. 16 is a diagram illustrating a light-emitting device according to variation 7 of embodiment 1.

FIG. 16 is a sectional view of light-emitting device 18 according to variation 7. More specifically, (a) of FIG. 16 is a top view of light-emitting device 18, (b) of FIG. 16 is a sectional view of light-emitting device 18 along the XVIA-XVIA line in (a) of FIG. 16, and (c) of FIG. 16 is a sectional view of light-emitting device 18 along the XVIB-XVIB line in (a) of FIG. 16.

Resin component 168 in light-emitting device 18 includes two protrusions 246 and 247 which are different in shape when viewed from the top.

Protrusion 247 is linearly extended in the top view. On the other hand, protrusion 246 includes bend portion 280 that is bending in the top view. In this embodiment, protrusion 246 is step-shaped in the top view. In other words, protrusion 246 includes the first linear portion, and the second linear portion which is offset from the first linear portion in the direction orthogonal to the lengthwise direction of the first linear portion and is continuous with the first linear portion. In this embodiment, the first linear portion and the second linear portion are parallel in the lengthwise direction and connected by bend portion 280.

Moreover, light transmissive component 130 is rectangular-shaped as denoted by the dashed line in (a) of FIG. 16.

Protrusion 246 is step-shaped in the top view, and thus in spite of light transmissive component 130 which is rectangular-shaped in the top view, the exposed width (in this embodiment, the length in the Y-axis direction) of exposed region 262 changes along one side of light transmissive component (in this embodiment, along the X-axis direction).

Moreover, a covered region of light transmissive component 130 covered by the cover portion of resin component 168 has a different cover width along the one side of light transmissive component 130 in the top view (in this embodiment, the edge on the positive side of the Y-axis). For example, the cover width (in this embodiment, the width in the Y-axis direction) of a region in which light transmissive component 130 is covered by cover portion 250c shown in (b) of FIG. 16 (i.e., covered region) is different from the cover width (in this embodiment, the width in the Y-axis direction) of a region in which light transmissive component 130 is covered by cover portion 250d shown in (c) of FIG. 16 (i.e., covered region).

In this manner, in the two parallel sectional views of light transmissive component 130 (e.g., the sectional view shown in (b) of FIG. 16 and the sectional view shown in (c) of FIG. 16), when the first exposed width (the length in the Y-axis direction in exposed region 262) in the first sectional view (e.g., the sectional view shown in (b) of FIG. 16) is greater than the second exposed width in the second sectional view (e.g., the sectional view shown in (c) of FIG. 16), the first cover width in the first sectional view is smaller than the second cover width in the second sectional view.

Figure 37:
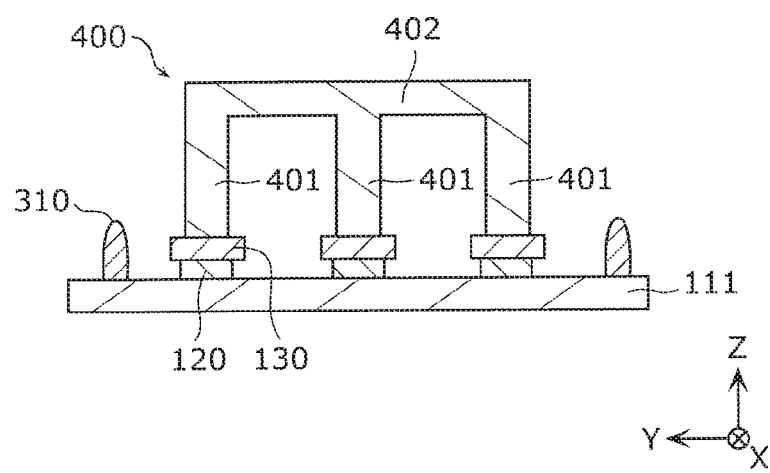
FIG. 37 is a sectional view illustrating example 2 of the method for manufacturing the light-emitting device according to the present disclosure.

With this, resin component 168 can be formed using a dispenser or mask 400 (e.g., see FIG. 37). Accordingly, in comparison with processing and shaping light transmissive component 130 in the top view, the spot of light emitted from light-emitting device 18 can be easily formed into a desired shape.

Moreover, in the direct-lense lighting device, the shape of exposed region 262 and the shape of the spot of the illumination light emitted from the lighting device are similar. Accordingly, an offset light distribution pattern for the low beam of the headlight can be easily achieved by including, in exposed region 262, an edge bending near the center of the X-axis to have a step in the X-axis direction.

It should be noted that protrusion 246 may be bended not in step shape but in slope shape in the top view.

<Variation 8>

Figure 17:
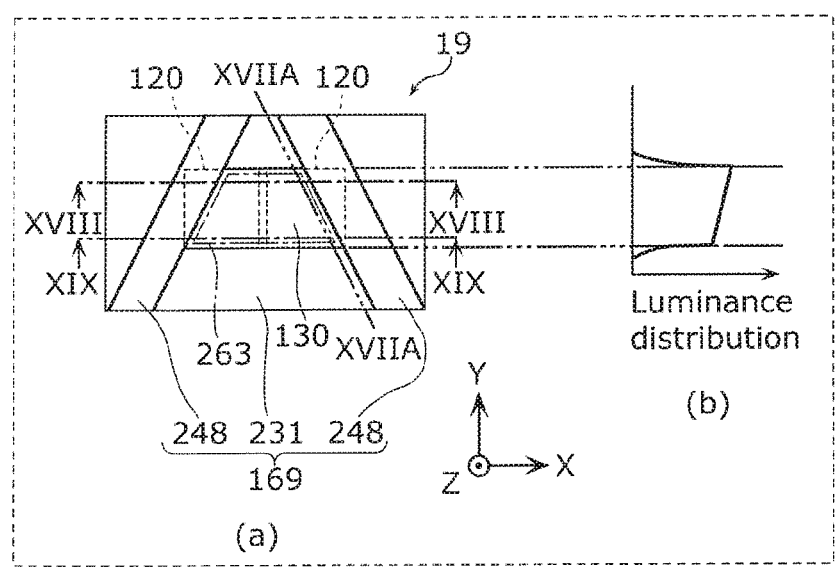
FIG. 17 is a diagram illustrating a light-emitting device according to variation 8 of embodiment 1.

FIG. 17 is a diagram illustrating light-emitting device 19 according to variation 8. More specifically, (a) of FIG. 17 is a top view of light-emitting device 19, and (b) of FIG. 17 is a diagram illustrating the luminance distribution of light emitted from light-emitting device 19.

Figure 18:
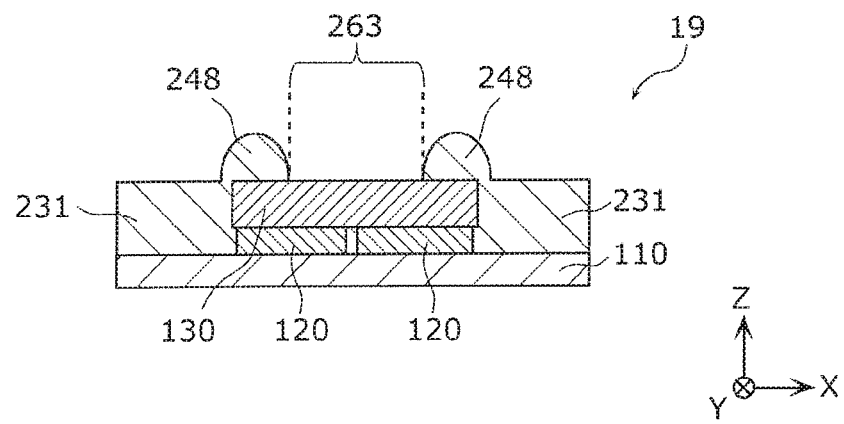
FIG. 18 is a sectional view of the light-emitting device according to variation 8 of embodiment 1 along the line XVIII-XVIII in FIG. 17.
Figure 19:
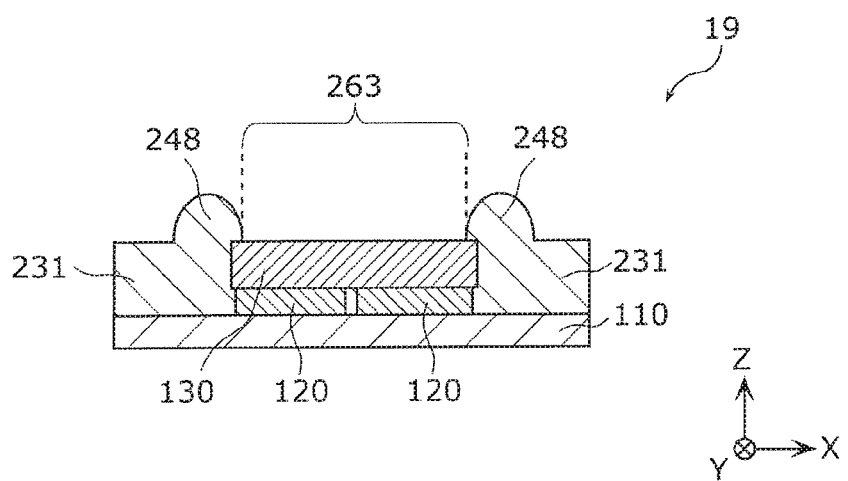
FIG. 19 is a sectional view of the light-emitting device according to variation 8 of embodiment 1 along the line XIX-XIX in FIG. 17.

FIG. 18 is a sectional view of light-emitting device 19 according to variation 8 along the line XVIII-XVIII in (a) of FIG. 17. FIG. 19 is a sectional view of light-emitting device 19 according to variation 8 along the line XIX-XIX in FIG. 17.

Two protrusion 248 included in resin component 169 in light-emitting device 19 are extended to cross each other in the top view. With this, exposed region 263 is formed into a substantially trapezoidal shape. It should be noted that also in this variation, light transmissive component 130 is rectangular-shaped in the top view.

The high beam of the headlight is required to illuminate an area ranging from a vehicle equipped with the headlight to a predetermined distance. The view angle of the width of a load to be illuminated decreases as the distance from the vehicle increases, and thus a light source for emitting the high beam is required to form a spot of illumination light into a substantially trapezoidal shape.

Moreover, in the direct-lense lighting device, the shape of exposed region 263 and the shape of the spot of illumination light emitted from the lighting device are similar. Accordingly, it is possible to achieve a light source appropriate to the light source for emitting the high beam by shaping exposed region 263 through which light is emitted into a substantially trapezoidal shape.

Moreover, light-emitting element 120 is rectangular-shaped in the top view. When light-emitting element 120 is rectangular-shaped in the top view and exposed region 263 is substantially trapezoidal-shaped, in the luminance distribution on the line XVIIA-XVIIA along protrusion 248, the luminance in the region closer to the short side of the substantially trapezoidal shape is higher, as shown in (b) of FIG. 17, since the cover portion is larger in the region closer to the short side of the substantially trapezoidal shape and light emitted from the vicinity of the reflective resin component (peripheral portion 231) further increases. In other words, in exposed region 263, the luminance in the region close to the short side of the substantially trapezoidal shape is higher than the luminance in the region close to the long side of the substantially trapezoidal shape, the short side being opposite the long side. Stated differently, in exposed region 263, the luminance in a position corresponding to the second exposed width (the region close to the short side of the substantially trapezoidal shape) is higher than the luminance in a position corresponding to the first exposed width (the region close to the long side of the substantially trapezoidal shape).

When light-emitting device 19 is used as a light source for the headlight that emits the high beam, the light source illuminates an area farther ahead of the vehicle in the region close to the short side than in the region close to the long side. Accordingly, light-emitting device 19 is especially suitable as the light source for emitting the high beam.

Figure 20:
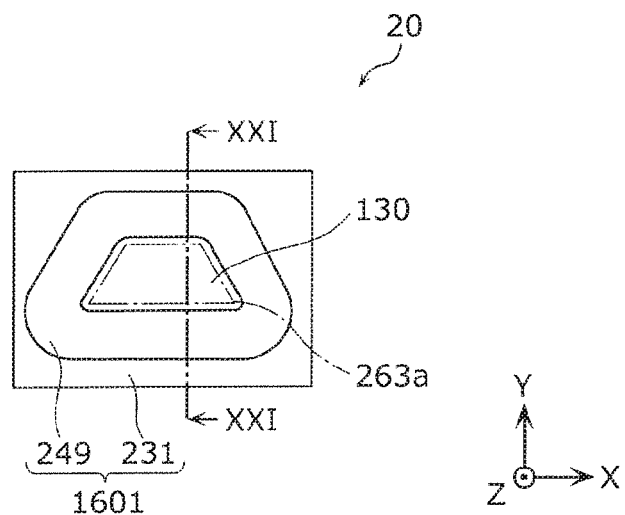
FIG. 20 is a top view of a light-emitting device according to another example of variation 8 of embodiment 1.
Figure 21:
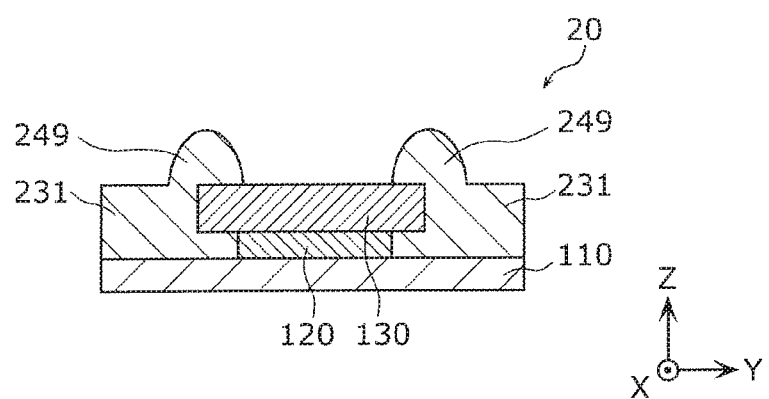
FIG. 21 is a sectional view of the light-emitting device according to the other example of variation 8 of embodiment 1 along the line XXI-XXI in FIG. 20.

FIG. 20 is the top view of light-emitting device 20 according to another example of variation 8. FIG. 21 is the sectional view of light-emitting device 20 according to the other example of variation 8 along the line XXI-XXI in FIG. 20.

Protrusion 249 included in resin component 1601 in light-emitting device 20 is annular and substantially trapezoidal shaped in the top view. With this, exposed region 263a is formed into a substantially trapezoidal shape with four round corners. In this manner, the shape of protrusion 249 in the top view is not particularly limited.

<Variation 9>

Figure 22:
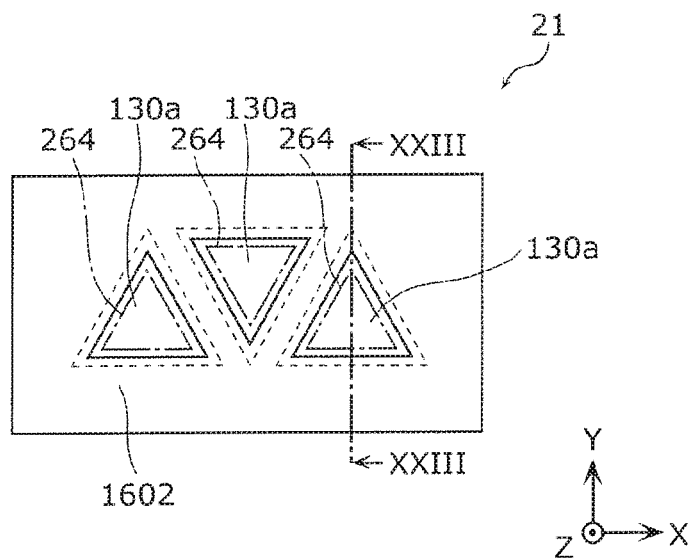
FIG. 22 is a top view of a light-emitting device according to variation 9 of embodiment 1.
Figure 23:
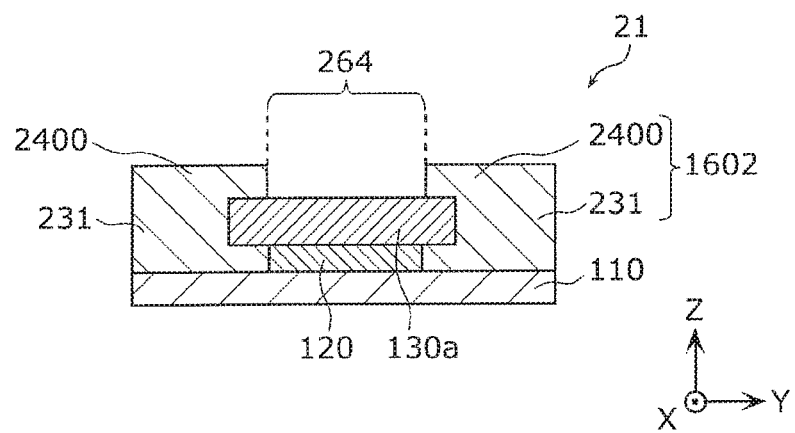
FIG. 23 is a sectional view of the light-emitting device according to variation 9 of embodiment 1 along the line XXIII-XXIII in FIG. 22.

FIG. 22 is the top view of light-emitting device 21 according to variation 9. FIG. 23 is the sectional view of light-emitting device 21 according to variation 9 along the line XXIII-XXIII in FIG. 22.

As denoted by the dashed line in FIG. 22, light transmissive component 130a is triangle-shaped in the top view. In this manner, the shape of light transmissive component 130a in light-emitting device 21 in the top view is not particularly limited. Moreover, light-emitting device 21 includes plural (in this embodiment, three) light transmissive components 130a. In this manner, the number of light transmissive components 130a in light-emitting device 21 is not particularly limited.

Moreover, protrusion 2400 included in resin component 1602 in light-emitting device 21 is formed to provide exposed region 264 for each of three light transmissive components 130a. In other words, light-emitting device 21 is provided with three triangle exposed regions 264 in the top view. In this manner, the shape and the number of exposed regions 264 in light-emitting device 21 are not particularly limited.

It should be noted that in this embodiment, three exposed regions 264 are formed into a substantially trapezoidal shape as a whole in combination with each other. In this manner, plural exposed regions 264 are combined, and thereby the entire contour of the exposed regions in light-emitting device 21 may be substantially trapezoidal-shaped.

<Variation 10>

Figure 24:
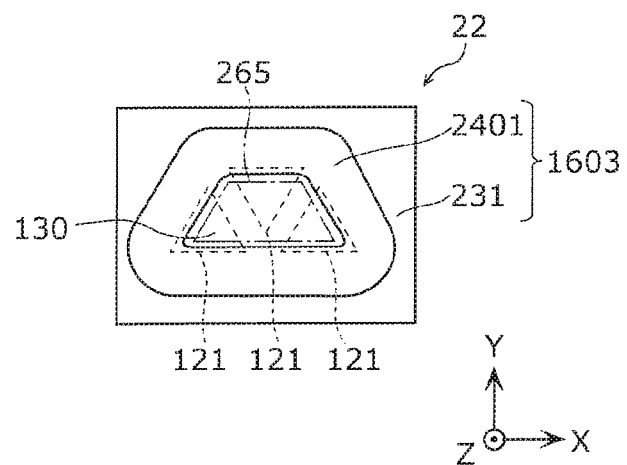
FIG. 24 is a top view of a light-emitting device according to variation 10 of embodiment 1.

FIG. 24 is the top view of light-emitting device 22 according to variation 10.

Protrusion 2401 included in resin component 1603 in light-emitting device 22 is annular and substantially trapezoidal shaped in the top view. With this, exposed region 265 is formed into a substantially trapezoidal shape.

Moreover, light-emitting element 121 is substantially triangular-shaped in the top view. In this embodiment, light-emitting element 121 is equilateral triangular-shaped in the top view. In this manner, the shape of light-emitting element 121 in the top view is not particularly limited. It should be noted that light-emitting element 121 which is equilateral triangular-shaped in the top view has an advantage that it is easy to be manufactured when a hexagonal nitride semiconductor is employed as the material of light-emitting element 121.

Moreover, when light-emitting element 121 is triangular-shaped in the top view and light-emitting device 22 includes odd numbers of (three or more) light-emitting elements 121, for example, light-emitting elements 121 are arranged in a line to alternate the vertices of the triangles. With this, light having the substantially trapezoidal-shaped spot is emitted from light-emitting elements 121 as a whole.

It should be noted that light-emitting device 22 may include a light transmissive component which is substantially trapezoidal-shaped in the top view. Alternatively, light-emitting device 22 may include plural light transmissive components 130a in light-emitting device 21 according to variation 9. In this case, the shape of plural light transmissive components 130a in the top view may be substantially trapezoidal as a whole. Moreover, plural (e.g., three) light transmissive components 130a may be disposed to correspond to plural (e.g., three) light-emitting elements 121 in the position and the shape in the top view.

With this, the spot of light emitted from light-emitting device 22 is formed into a substantially trapezoidal shape. Accordingly, light-emitting device 22 is suitable as the light source for the headlight for emitting the high beam.

<Variation 11>

Figure 25:
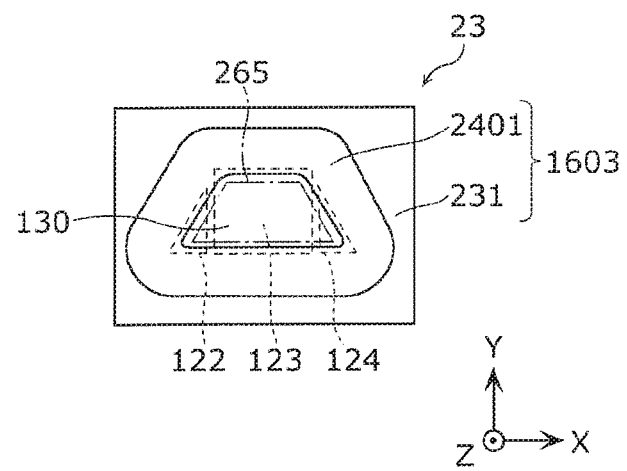
FIG. 25 is a top view of a light-emitting device according to variation 11 of embodiment 1.

FIG. 25 is a top view of light-emitting device 23 according to variation 11.

Light-emitting device 23 includes three light-emitting elements 122, 123, and 124.

Light-emitting elements 122 and 124 are each triangular-shaped in the top view. Moreover, light-emitting element 123 is quadrangular (rectangular)-shaped in the top view. In this manner, light-emitting device 23 may include plural light-emitting elements 122, 123, and 124 which are differently shaped in the top view. In this embodiment, light-emitting elements 122 and 124 are each substantially right triangular-shaped in the top view. Moreover, plural light-emitting elements 122, 123, and 124 are arranged such that the shape of plural light-emitting elements 122, 123, and 124 is formed into a substantially trapezoidal shape as a whole in the top view. For example, plural light-emitting elements 122, 123, and 124 are arranged in a line.

As described above, in the case where a light-emitting device includes plural light-emitting elements, the spot of light which is emitted as a whole from the light-emitting elements and exits from the light-emitting device is easily formed into a trapezoidal shape by using a triangular-shaped light-emitting element in the top view (e.g., light-emitting element 121).

For example, when a light-emitting device including plural light-emitting elements which emit light having the shape of spot formed into a trapezoidal shape as a whole includes a light transmissive component having a trapezoidal shape similar to this shape of spot, the light transmissive component can efficiently guide the light emitted from the light-emitting elements and cause the guided light to exit through the exposed region.

[Manufacturing Method]

Next, a method for manufacturing a light-emitting device according to the present disclosure will be described with reference to FIG. 26 through FIG. 40.

<Outline>

Figure 26:
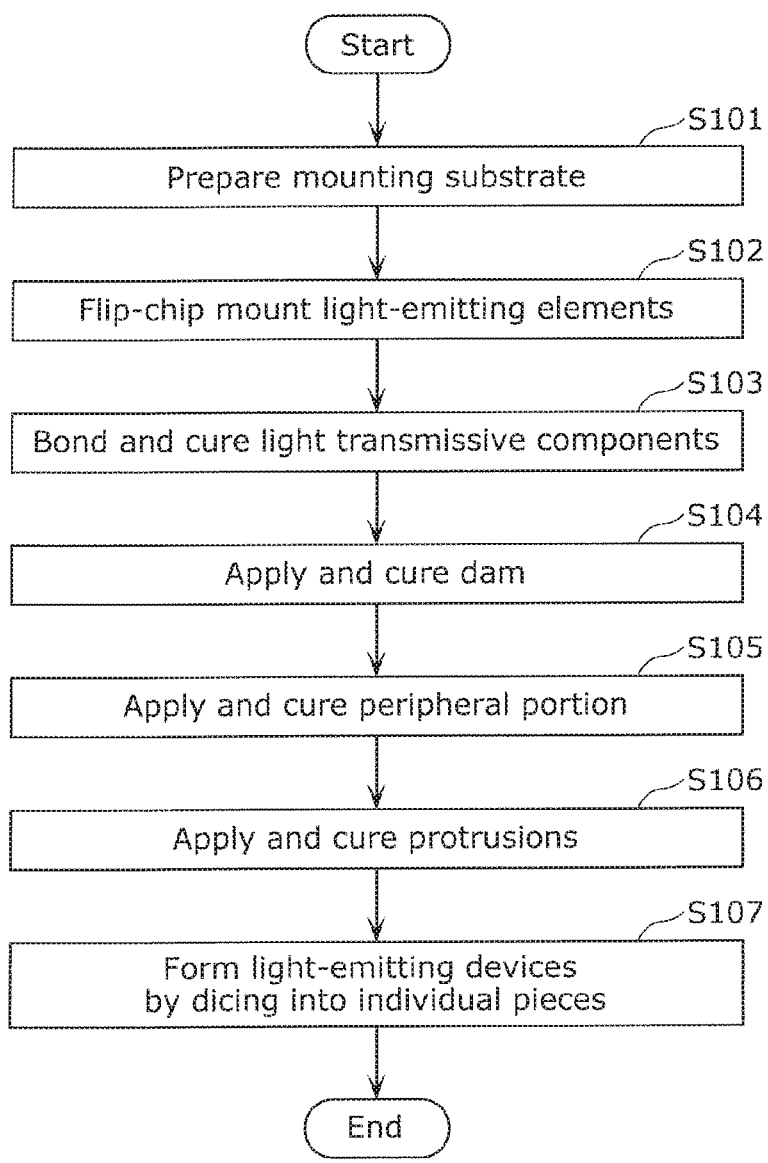
FIG. 26 is a flowchart illustrating a method for manufacturing a light-emitting device according to the present disclosure.

FIG. 26 is a flowchart illustrating the method for manufacturing light-emitting device 10 according to the present disclosure. It should be noted that in the description of FIG. 26, the outline of the method for manufacturing light-emitting device 10 will be described as an example.

Firstly, mounting substrate 110 is prepared (S101). For example, collective substrate wafer 111 (for example, see FIG. 27) in which pieces each forming mounting substrate 110 are arranged in a matrix is prepared.

Subsequently, light-emitting elements 120 are flip-chip mounted on mounting substrate 110 (S102).

Subsequently, a transparent resin is applied on light-emitting elements 120, light transmissive component 130 is bonded to the transparent resin, and the transparent resin is cured (S103).

Subsequently, a resin serving as resin dam 310 (for example, see FIG. 30) is applied and cured on collective substrate wafer 111 to surround the entire area where light-emitting elements 120 are disposed (S104).

Subsequently, a resin serving as peripheral portion 230 and having a lower viscosity than protrusion 240 is applied (filled) and semi-cured around light-emitting elements 120 and light transmissive component 130 (S105).

Here, for example, the resin serving as peripheral portion 230 is applied such that the top surface of peripheral portion 230 is substantially leveled with topmost surface 190 of light transmissive component 130. Here, it should be noted that the resin serving as peripheral portion 230 need not be completely cured (solidified). At step S105, for example, the resin serving as peripheral portion 230 is semi-cured by being heated in a furnace. The furnace temperature is approximately 80 degrees C., for example.

Subsequently, a resin serving as protrusion 240 and having a higher viscosity than peripheral portion 230 is applied and cured to overlap with light transmissive component 130 and the resin serving as peripheral portion 230, i.e., to cover the outer edge portion of light transmissive component 130 and be in contact with the resin serving as peripheral portion 230 (S106). At step S106, for example, the resin serving as protrusion 240 is cured by being heated in the furnace. The furnace temperature is approximately 150 degrees C., for example. Moreover, for example, at step S106, the resin serving as peripheral portion 230 and the resin serving as protrusion 240 are cured by being heated in the furnace for 3 hours.

The resin serving as protrusion 240 is less spread in the horizontal direction due to the high viscosity.

When the resin serving as protrusion 240 is applied under the furnace temperature of approximately 80 degrees C., a semi-cured surface layer is formed on the surface of the resin simultaneously with the application. Accordingly, it is possible to prevent the resin serving as protrusion 240 from being spread in the horizontal direction after the application. With this, it is possible to appropriately control the size and shape of exposed region 260.

Subsequently, light-emitting device 10 including cover portion 250 and exposed region 260 is formed by dicing collective substrate wafer 111 into individual pieces (S107).

For example, the resin serving as protrusion 240 and having a higher viscosity than the resin serving as peripheral portion 230 is linearly applied while the filled resin serving as peripheral portion 230 is not completely cured (i.e., is semi-cured) at step S105, and subsequently the resin serving as peripheral portion 230 and the resin serving as protrusion 240 are simultaneously cured. In this manner, peripheral portion 230 and protrusion 240 are integrated and the bonding is further enhanced. For example, peripheral portion 230 and protrusion 240 are integrated to the extent that almost no interface (bond interface) can be visually recognized between peripheral portion 230 and protrusion 240.

According to the above manufacturing method, in comparison with a manufacturing method in which exposed region 260 is formed by superposing a small glass plate on the light transmissive component 130 or forming light transmissive component 130 in contact with a glass plate and subsequently grinding the glass plate to downsize the glass plate, it is possible to reduce the steps, cracking and chipping caused by processing and mounting, and manufacturing costs.

Example 1

Next, example 1 of the method for manufacturing the light-emitting device according to the present disclosure will be described with reference to FIG. 27 through FIG. 33. In example 1, for example, a method for manufacturing light-emitting device 10 will be described.

FIG. 27 through FIG. 33 are each a top view illustrating example 1 of the method for manufacturing light-emitting device 10 according to the present disclosure.

Figure 27:
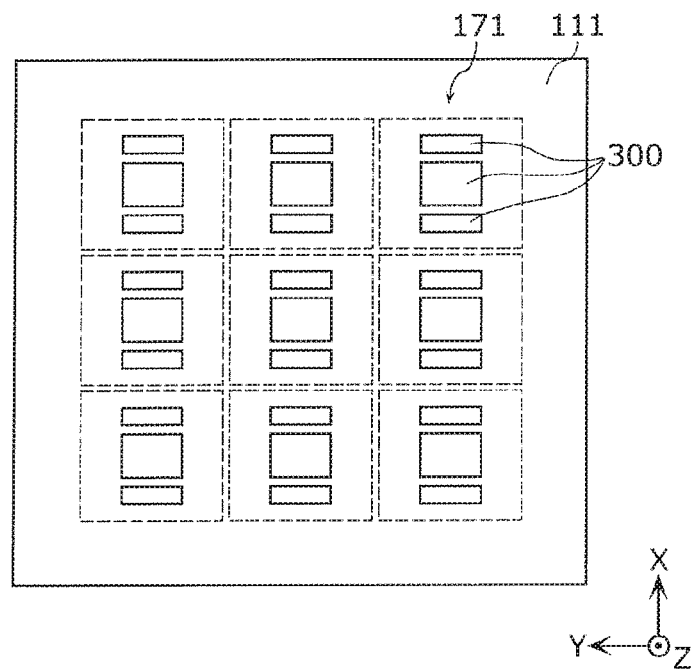
FIG. 27 is a top view illustrating example 1 of the method for manufacturing the light-emitting device according to the present disclosure.

Firstly, as shown in FIG. 27, collective substrate wafer 111 which is a collectivity of mounting substrates 110 each used as a submount or the like on which conductive pattern 300 is formed is prepared. Mounting substrate 110 is made by cutting collective substrate wafer 111 into pieces. For example, when light-emitting device 10 is made, collective substrate wafer 111 is cut into pieces along the dashed line in FIG. 27 (i.e., the wafer is diced). In other words, the dashed line shown in FIG. 27 denotes the contours of mounting substrates 110 after collective substrate wafer 111 is cut into pieces. For example, a sintered AlN substrate is used for collective substrate wafer 111 (mounting substrate 110).

In collective substrate wafer 111, conductive patterns 300 of Au are formed in a matrix. Each conductive pattern 300 is electrically connected to a connection terminal (not shown) on a back surface opposite to mounting surface 171 of collective substrate wafer 111.

It should be noted that when one light-emitting device 10 includes plural light-emitting elements 120, it is sufficient that each conductive pattern 300 is appropriately formed on collective substrate wafer 111 to implement series connection or parallel connection using flip chip connection. In other words, each conductive pattern 300 may be formed on mounting surface 171 of collective substrate wafer 111 in any layout.

For example, FIG. 27 illustrates the layout of conductive pattern 300 when two light-emitting elements 120 are connected in series.

It should be noted that although actual conductive pattern 300 on mounting substrate 110 has a complicated shape corresponding to an electrode pattern of light-emitting element 120, the illustration is simplified in this embodiment.

Moreover, although not shown in the drawings, a terminal for supplying power from the outside to light-emitting element 120 is formed on the back surface of mounting substrate 110, and is electrically connected to conductive pattern 300 via a through hole provided inside mounting substrate 110.

Figure 28:
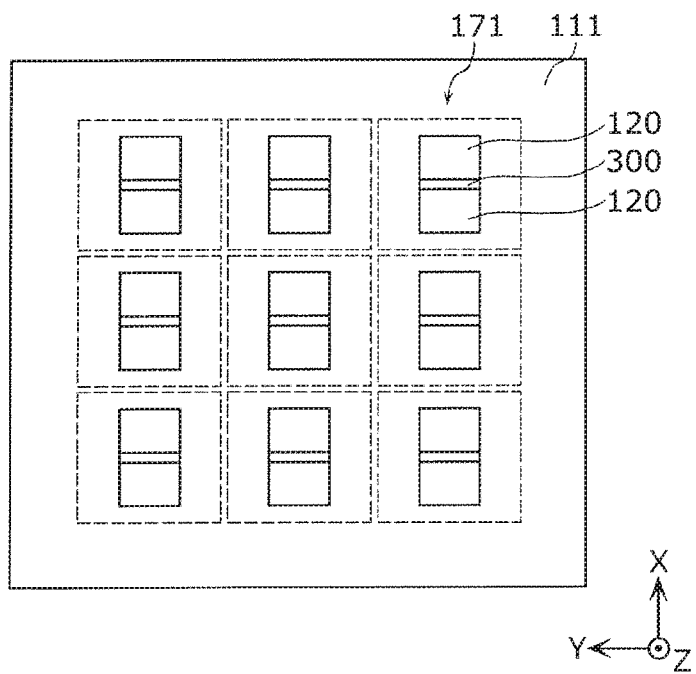
FIG. 28 is a top view illustrating example 1 of the method for manufacturing the light-emitting device according to the present disclosure.

Subsequently, as shown in FIG. 28, light-emitting elements 120 are mounted (e.g., flip-chip mounted) on collective substrate wafer 111.

A blue LED chip in which a nitride compound semiconductor is formed on a GaN substrate is taken as an example of each light-emitting element 120. For example, light-emitting element 120 and conductive pattern 300 are connected by forming Au bumps on a metal pad of light-emitting element 120, placing light-emitting element 120 on collective substrate wafer 111 with the growth-substrate side of light-emitting element 120 up using a flip-chip method, and ultrasonic-welding between light-emitting element 120 and conductive pattern 300.

It should be noted that the growth substrate may have a micro texture structure in which the back surface (i.e., the top surface of the implemented light-emitting element 120) is roughed. An etching process, a blast process, a process using a laser or a dicing blade, or the like is taken as an example of a method for roughing the back surface of the growth substrate (e.g., a method for forming fine asperities on the back surface).

When a base having a lower refractive index than GaN, such as sapphire, is employed as a base material of the growth substrate, the back surface of the growth substrate may be flat.

Figure 29:
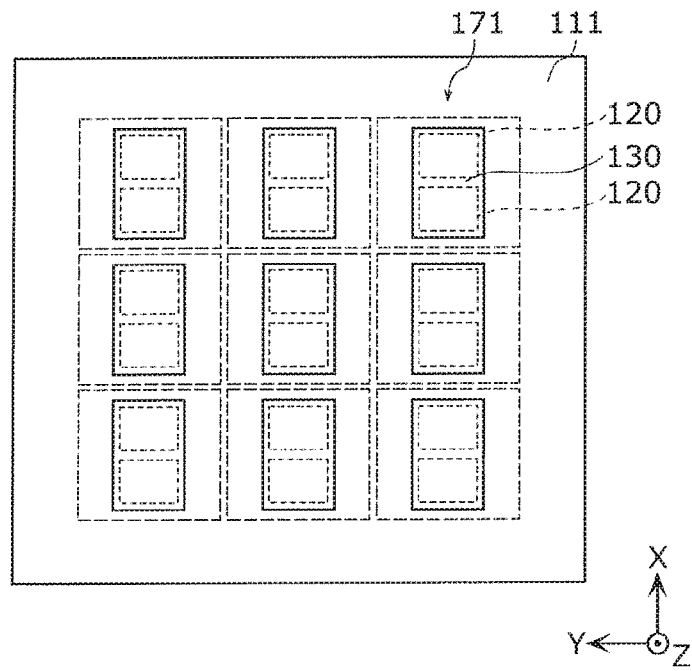
FIG. 29 is a top view illustrating example 1 of the method for manufacturing the light-emitting device according to the present disclosure.

Subsequently, as shown in FIG. 29, light transmissive component 130 is disposed on light-emitting elements 120 and bonded to light-emitting elements 120.

Firstly, a predetermined amount of a transparent resin is applied with a dispenser as an adhesive, to the center of the back surface of the growth substrate in light-emitting element 120. The transparent resin is a silicone resin, for example. Next, light transmissive component 130 is placed on the transparent resin and pressed downward such that the transparent resin covers the entire top surfaces of light-emitting elements 120. Then, the transparent resin is cured by heating for 3 hours at the furnace temperature of 150 degrees C.

It should be noted that although the dispenser (a dispensing method) is used to apply the transparent resin, any other methods and devices such as a stamp method may be used.

Figure 30:
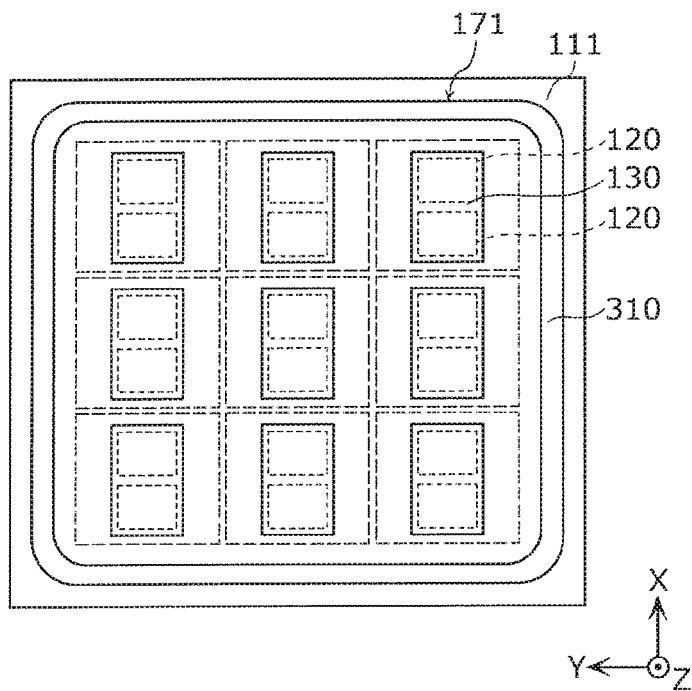
FIG. 30 is a top view illustrating example 1 of the method for manufacturing the light-emitting device according to the present disclosure.

Subsequently, as shown in FIG. 30, resin dam 310 is formed on collective substrate wafer 111 such that all plural light-emitting elements 120 are surrounded in the top view.

Resin dam 310 prevents a resin (a reflective resin) serving as peripheral portion 230, covering side surface 180 and the bottom surface of light-emitting element 120, and to be used at the next step from flowing to the outside.

It should be noted that resin dam 310 does not remain in light-emitting device 10 after collective substrate wafer 111 is cut into pieces to form light-emitting device 10.

For example, resin dam 310 is formed by linearly applying a paste-shaped dam material in a predetermined position on collective substrate wafer 111 heated to a constant temperature. For example, the dam material is a dimethyl silicone resin in which a light reflective material of titanium oxide ($TiO_2$) is dispersed.

Figure 31:
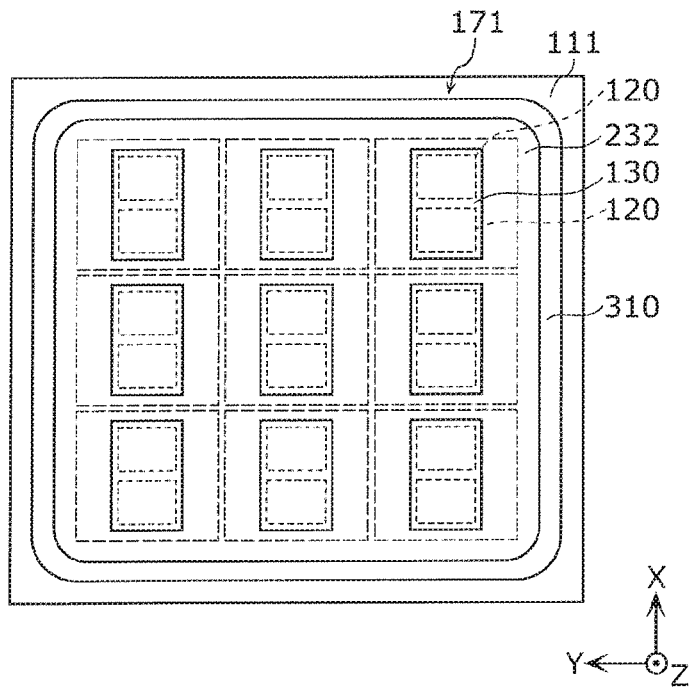
FIG. 31 is a top view illustrating example 1 of the method for manufacturing the light-emitting device according to the present disclosure.

Subsequently, as shown in FIG. 31, peripheral portion 232 is formed between resin dam 310 and light-emitting elements 120. For example, peripheral portion 232 is a resin component serving as peripheral portion 230. More specifically, after resin dam 310 is formed, peripheral portion 232 of a reflective component material is injected between resin dam 310 and light-emitting elements 120. For example, a low-viscosity dimethyl silicone resin containing dispersed $TiO_2$ particles is employed as the reflective component material.

After peripheral portion 232 spreads out between resin dam 310 and light-emitting elements 120 and the surface of peripheral portion 232 is flatten, the next step is performed.

Peripheral portion 232 is a region on collective substrate wafer 111 with light-emitting elements 120, and surrounds the bottom surfaces and side surfaces 180 of light-emitting elements 120, the transparent resin (the adhesive for bonding light-emitting elements 120 and light transmissive component 130), and light transmissive component 130.

The material for peripheral portion 232 is not limited to a silicone resin. Another low-viscosity liquid using, as a main material, a glass or a resin such as an epoxy resin, an acryl resin, a polyimide resin, a urea resin, or a fluorine resin, and containing dispersed light reflective material particles is possible. For example, titanium oxide particles or zinc oxide particles are employed as the light reflective material.

Peripheral portion 230 is formed by curing liquid peripheral portion 232 which is a liquid resin containing light-reflective material and disperser, and cutting the cured peripheral portion 232 into pieces.

More specifically, the powdered titanium oxide and disperser are put into the low-viscosity liquid including a liquid resin or glass as a main material, and this mixture is heated for approximately 5 to 10 minutes at least at the gelation temperature of the liquid resin or glass.

With this, the shape of peripheral portion 232 is stabilized, and thus the shape is less deformed when protrusion 2402 which is a resin having a higher viscosity than peripheral portion 232 is linearly applied to peripheral portion 232.

Figure 32:
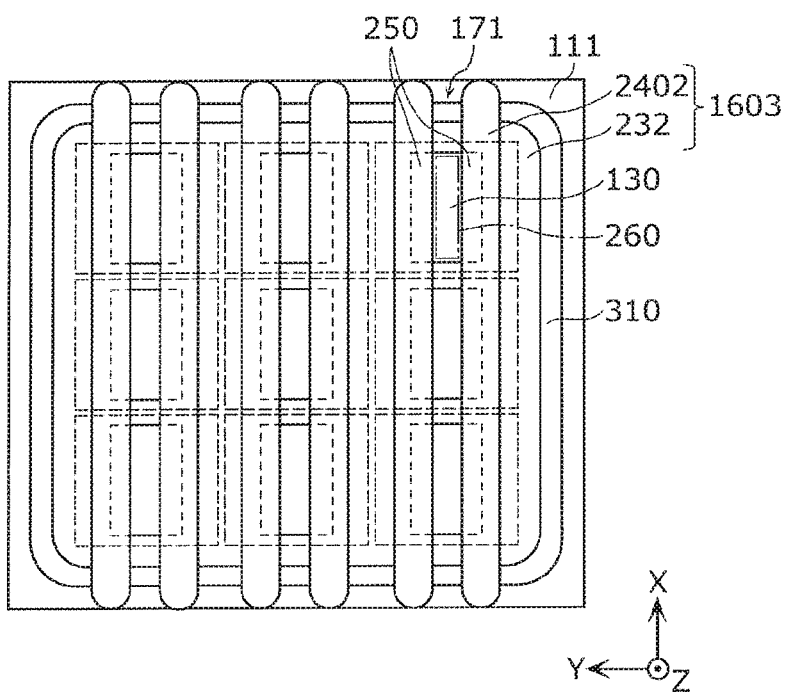
FIG. 32 is a top view illustrating example 1 of the method for manufacturing the light-emitting device according to the present disclosure.

Subsequently, as shown in FIG. 32, a resin serving as linear protrusion 240 (referred to as protrusion 2402) is formed on the interface between light transmissive component 130 and peripheral portion 232 to extend across plural pieces each forming light-emitting device 10 in the top view. For example, protrusion 2402 which is a thermosetting resin material having a higher viscosity than peripheral portion 232 is linearly applied to a predetermined position on collective substrate wafer 111 heated to the temperature of 95 degrees C. Peripheral portion 232 is semi-cured by heating before this application.

For example, protrusion 2402 is a silicone resin in which a light reflective material of titanium oxide ($TiO_2$) is dispersed. Here, protrusion 2402 is needed to have a viscosity to keep the shape even after applying it to collective substrate wafer 111.

In the dispensing method, the viscosity of protrusion 2402 is better to be high to keep the shape after protrusion 2402 is linearly applied to collective substrate wafer 111. On the other hand, when the viscosity is too high, it is difficult to discharge the resin material (protrusion 2402) from a nozzle used in the dispensing method.

In view of this, the inventors of this application studied under the conditions: the inner diameter of the outlet of the nozzle for discharging protrusion 2402 is 250 μm; the ambient temperature when protrusion 2402 is applied to collective substrate wafer 111 is 30 degrees C.; the viscosity of protrusion 2402 at the temperature of 30 degrees C. is 200 Pa·s; the application speed is 2.8 mm/s; and protrusion 2402 is linearly applied to collective substrate wafer 111 using the nozzle.

It should be noted that in this study, protrusion 2402 has been applied across plural light-emitting devices 10 (i.e., continuously applied to collective substrate wafer 111 in positions of the pieces each forming light-emitting device 10 after the dicing). Needless to say, protrusion 2402 may be separately applied to the positions of the pieces each forming light-emitting device 10 after the dicing.

Next, in order to stabilize the shape of applied protrusion 2402, protrusion 2402 has started to be cured, i.e., heated within 8 hours or less after the application of protrusion 2402. Here, protrusion 2402 has been completely cured (thermally cured) by heating for three hours at the temperature of 150 degrees C. in an air atmosphere.

Due to the above conditions, the width of protrusion 2402 (the length in a direction orthogonal to the extension direction) is substantially constant even after the curing, and the variation in the width (an offset of the maximum or minimum width from the average of widths) is 10% or less.

From the above study, the inventors of this application found the application conditions for protrusion 2402 capable of reducing the variation in the width.

Moreover, as shown in FIG. 2, protrusion 240 for preventing light transmissive component 130 from being removed is formed on the outer edge of topmost surface 190 of light transmissive component 130 by applying and curing protrusion 2402 to collective substrate wafer 111 under the above conditions. Furthermore, peripheral portion 232 and protrusion 2402 are firmly bonded by applying and curing protrusion 2402 to collective substrate wafer 111 under the above conditions. Resin component 1603 including peripheral portion 232 and protrusion 2402 is separated into resin components 160 by dicing collective substrate wafer 111 as described below. Moreover, exposed region 260 is formed in the topmost surface 190.

Figure 33:
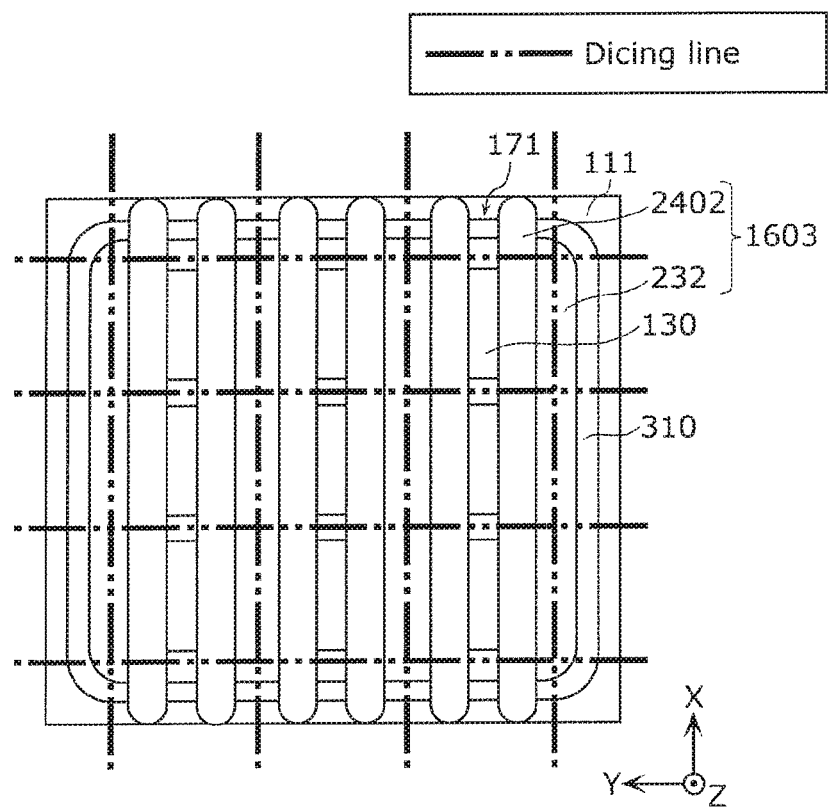
FIG. 33 is a top view illustrating example 1 of the method for manufacturing the light-emitting device according to the present disclosure.

Subsequently, as shown in FIG. 33, plural light-emitting devices 10 are formed by cutting (also referred to as separating or dicing) collective substrate wafer 111 along the dicing lines denoted by the dashed double-dotted lines in FIG. 33. The dicing is performed using a grindstone (also referred to a dicing blade). When hard collective substrate wafer 111 such as AlN is cut, the width of the dicing blade is at least approximately 100 μm and at most approximately 150 μm, for example.

According to the manufacturing method described above, light-emitting devices 10 can be manufactured.

It should be noted that protrusion 2402 need not be linear-shaped in the top view.

Figure 34:
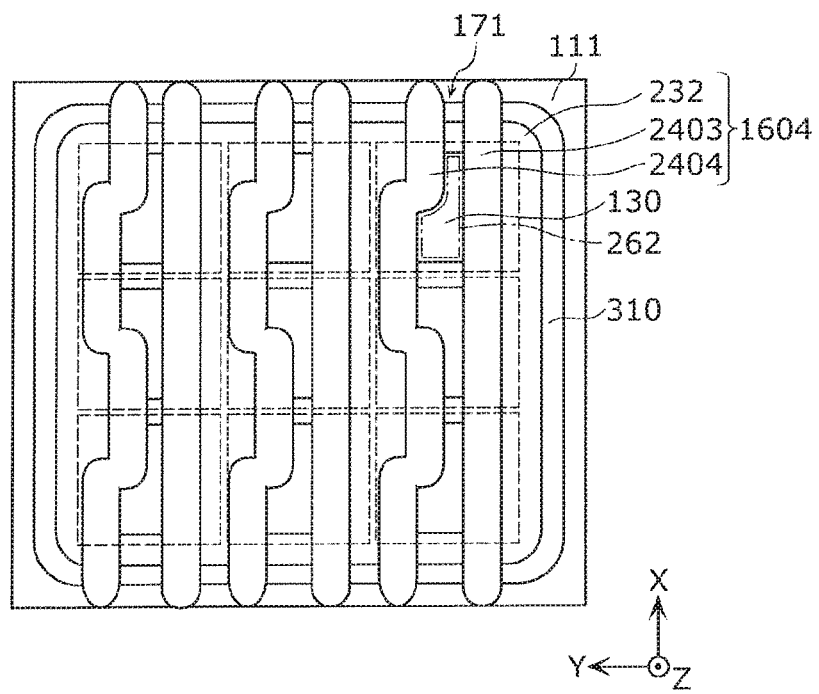
FIG. 34 is a top view illustrating variation 1 of a protrusion.

FIG. 34 is the top view illustrating variation 1 of protrusion 2402 (protrusion 2403 and protrusion 2404). It should be noted that FIG. 34 is a diagram illustrating another example of the manufacturing step shown in FIG. 32.

Resin component 1604 is a resin including peripheral portion 232, protrusion 2403, and protrusion 2404, and for example, serves as resin component 168 shown in FIG. 16 by dicing collective substrate wafer 111. Moreover, for example, peripheral portion 232 serves as peripheral portion 231 shown in FIG. 16 by being cured and diced. Moreover, for example, protrusion 2403 serves as protrusion 247 shown in FIG. 16 by being cured and diced. Moreover, for example, protrusion 2404 serves as protrusion 246 shown in FIG. 16 by being cured and diced.

Exposed region 262 having one step-shaped side in the top view as shown in FIG. 34 can be formed by applying protrusion 2403 and protrusion 2404 as shown in FIG. 34.

Figure 35:
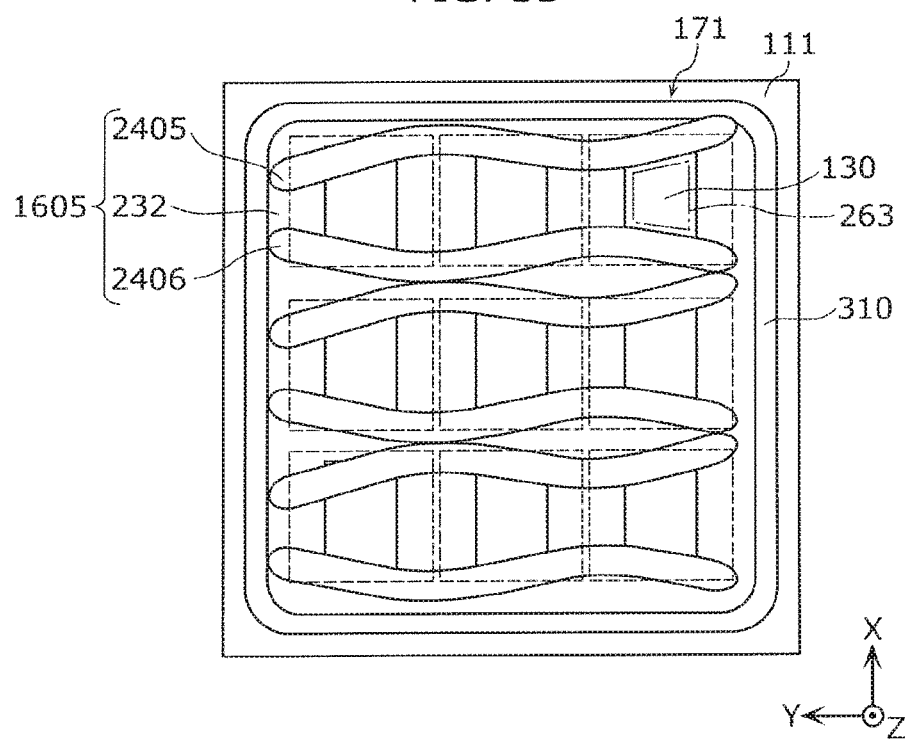
FIG. 35 is a top view illustrating variation 2 of the protrusion.

FIG. 35 is the top view illustrating variation 2 of protrusion 2402 (protrusion 2405 and protrusion 2406). It should be noted that FIG. 35 is a diagram illustrating another example of the manufacturing step shown in FIG. 32.

Resin component 1605 is a resin including peripheral portion 232, protrusion 2405, and protrusion 2406, and for example, serves as resin component 169 shown in FIG. 17 by dicing collective substrate wafer 111. Moreover, for example, peripheral portion 232 serves as peripheral portion 231 shown in FIG. 17 by being cured and diced. Moreover, for example, protrusion 2405 and protrusion 2406 serves as protrusion 248 shown in FIG. 17 by being cured and diced.

Exposed region 263 having a substantially trapezoidal shape in the top view as shown in FIG. 35 can be formed by applying protrusion 2405 and protrusion 2406 as shown in FIG. 35.

Example 2

Next, example 2 of the method for manufacturing the light-emitting device according to the present disclosure will be described with reference to FIG. 36 through FIG. 41. In example 2, for example, the method for manufacturing light-emitting device 11a according to variation 12 in which the shape of light-emitting device 11a is the same as that of light-emitting device 11 and peripheral portion 230 and protrusion 241 are integrated (see FIG. 41).

It should be noted that the steps are the same as those of example 1 shown in FIG. 27 through FIG. 31, and thus the duplicated description is omitted.

FIG. 36 through FIG. 41 are each a top view or a sectional view illustrating example 2 of the method for manufacturing the light-emitting device according to the present disclosure. It should be noted that in FIG. 36, a region in which mask 400 is contact with light transmissive component 130 is hatched.

In example 2, mask 400 is used to form cover portion 252 and exposed region 266 on light transmissive component 130.

Figure 36:
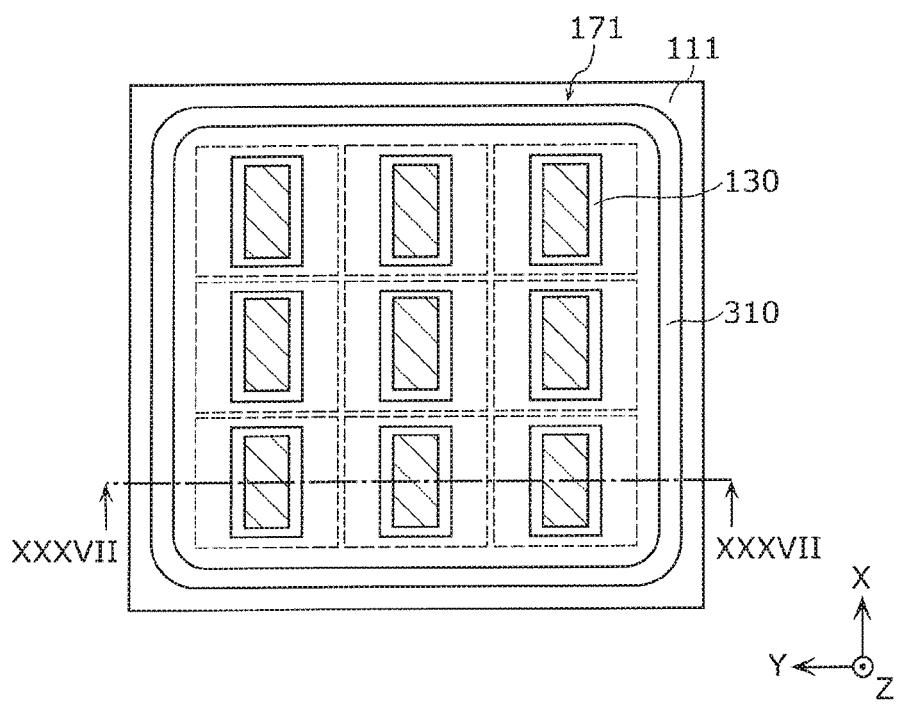
FIG. 36 is a top view illustrating example 2 of the method for manufacturing the light-emitting device according to the present disclosure.

Following the step described using FIG. 31, as shown in FIG. 36 and FIG. 37, 3-dimensional mask 400 is disposed on light transmissive component 130. For example, mask 400 is made of a cured silicone resin.

Mask 400 includes plural pole elements 401 each of which is pole-shaped and has an area in contact with light transmissive component 130 smaller than that of light transmissive component 130 (an area in the top view), and plural pole elements 401 are integrated with upper holder 402. Mask 400 is disposed such that the bottoms of pole elements 401 are contact with the top surfaces of light transmissive components 130, respectively.

Figure 38:
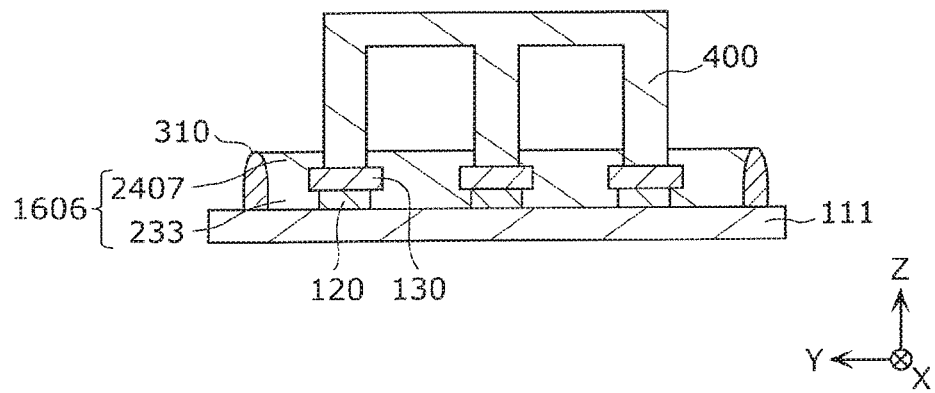
FIG. 38 is a sectional view illustrating example 2 of the method for manufacturing the light-emitting device according to the present disclosure.

Subsequently, as shown in FIG. 38, liquid resin component 1606 is injected (applied) between resin dam 310 and light-emitting elements 120 while a part of each light transmissive component 130 is covered by mask 400. For example, resin component 1606 is a silicone resin.

Figure 41:
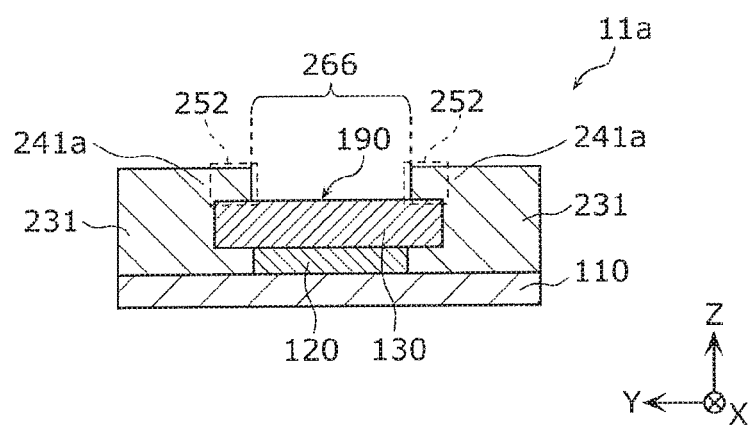
FIG. 41 is a sectional view illustrating example 2 of the method for manufacturing the light-emitting device according to the present disclosure.

A part of resin component 1606 is peripheral portion 233, and serves as peripheral portion 231 shown in FIG. 41 by being cured and diced. Another part of resin component 1606 is protrusion 2407, and serves as protrusion 241a shown in FIG. 41 by being cured and diced.

Furthermore, resin component 1606 is cured by heating for three hours at the temperature of 150 degrees C. while a part of each light transmissive component 130 is covered by mask 400.

Figure 39:
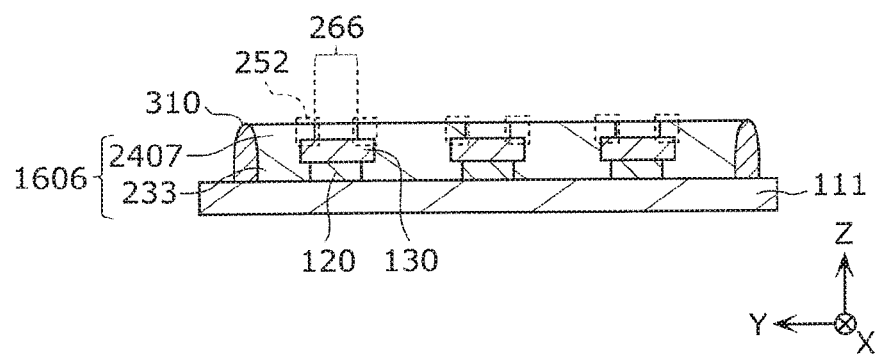
FIG. 39 is a sectional view illustrating example 2 of the method for manufacturing the light-emitting device according to the present disclosure.

Subsequently, as shown in FIG. 39, mask 400 is removed. With this, cover portion 252 covering light transmissive component 130 and exposed region 266 not covered by cover portion 252 are formed.

Here, a silicone resin is employed as resin component 1606 and a cured silicone resin is employed as mask 400. Accordingly, when resin component 1606 is injected (applied) and cured in contact with mask 400, mask 400 can be easily removed after the curing of resin component 1606 since the adhesion between resin component 1606 and mask 400 is low. In view of this, the cured silicone resin is suitable for mask 400.

Figure 40:
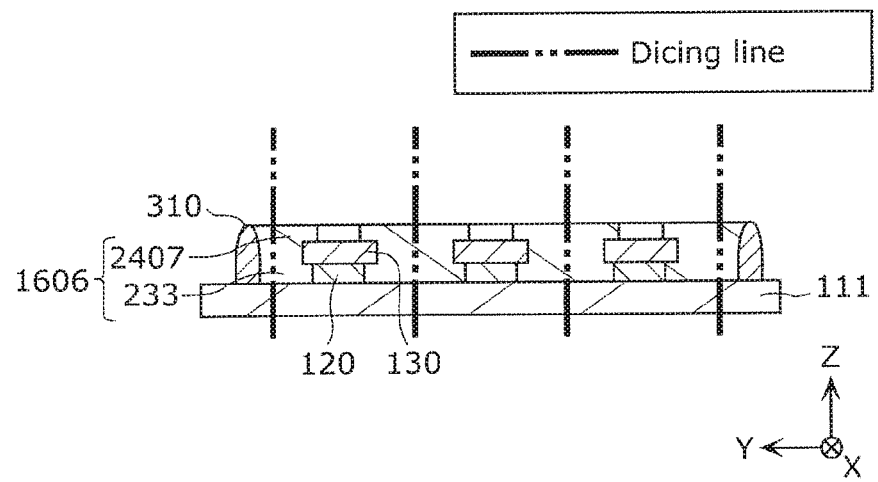
FIG. 40 is a sectional view illustrating example 2 of the method for manufacturing the light-emitting device according to the present disclosure.

Subsequently, as shown in FIG. 40, plural light-emitting devices 11a each shown in FIG. 41 are formed by cutting collective substrate wafer 111 along the dicing lines denoted by the dashed double-dotted lines in FIG. 40.

Embodiment 2

Next, a light-emitting device according to embodiment 2 will be described. It should be noted that in the description of the light-emitting device according to embodiment 2, the components substantially identical to those of the light-emitting devices according to embodiment 1 and variations of embodiment 1 are assigned the same reference signs, and overlapping descriptions thereof may be omitted or simplified.

[Configuration]

Figure 42:
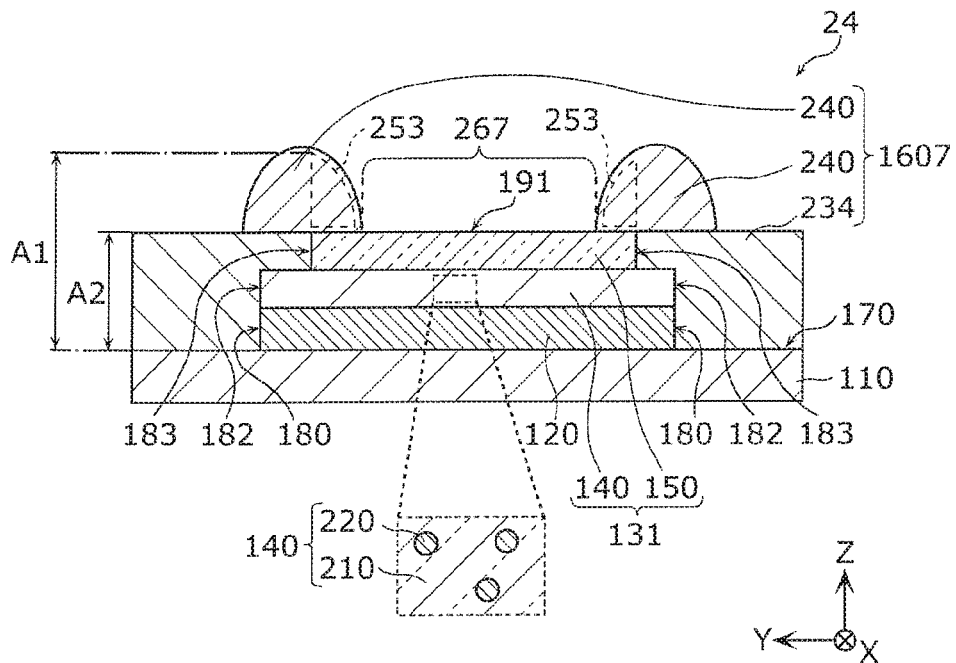
FIG. 42 is a sectional view of a light-emitting device according to embodiment 2.

FIG. 42 is a sectional view of light-emitting device 24 according to embodiment 2. It should be noted that the sectional view shown in FIG. 42 corresponds to the sectional view of FIG. 2. For example, the top view of light-emitting device 24 is the same as that of light-emitting device 10 shown in (a) of FIG. 1.

As shown in FIG. 42, light-emitting device 24 includes mounting substrate 110, light-emitting elements 120, light transmissive component 131, and resin component 1607.

Light transmissive component 131 transmits light emitted by light-emitting element 120. In this embodiment, light transmissive component 131 includes first light transmissive component 140 and second light transmissive component 150.

First light transmissive component 140 and second light transmissive component 150 are each a component that transmits light emitted by light-emitting element 120.

Moreover, in this embodiment, first light transmissive component 140 and second light transmissive component 150 are each rectangular plate-shaped in the top view.

It should be noted that the shapes of first light transmissive component 140 and second light transmissive component 150 in the top view are not particularly limited.

Moreover, first light transmissive component 140 is bonded to the top surface of light-emitting element 120. Moreover, second light transmissive component 150 is bonded to the top surface of first light transmissive component 140. In other words, light transmissive component 131 includes first light transmissive component 140 and second light transmissive component 150 stacked in this order from the mounting surface 170 side.

Moreover, in the top view of mounting substrate 110, the outer periphery of second light transmissive component 150 is located inward of the outer periphery of first light transmissive component 140.

Moreover, first light transmissive component 140 contains phosphor 220. More specifically, first light transmissive component 140 includes binder 210 and phosphor 220, for example. Accordingly, first light transmissive component 140 emits fluorescence light using a part of light emitted by light-emitting element 120 as excitation light. Thus, in this embodiment, first light transmissive component 140 (more specifically, phosphor 220 contained in first light transmissive component 140) emits yellow light (yellow fluorescence light) using the blue light emitted by light-emitting element 120 as excitation light.

On the other hand, second light transmissive component 150 does not contain phosphor 220, and is made of a transmissive resin material (e.g., the same material as binder 210), a glass, a ceramic, or the like. Accordingly, second light transmissive component 150 transmits light emitted by light-emitting element 120 and fluorescence light emitted by first light transmissive component 140. In this embodiment, second light transmissive component 150 is a glass.

Resin component 1607 surrounds light-emitting elements 120 and light transmissive component 131. In particular, resin component 1607 is disposed in contact with light-emitting elements 120 and light transmissive component 131. More specifically, resin component 1607 is disposed on mounting surface 170 in contact with side surface 180 of light-emitting element 120, side surface 182 of first light transmissive component 140, and side surface 183 of second light transmissive component 150.

A silicone resin, an epoxy resin, or the like is taken as an example of resin component 1607.

Moreover, in this embodiment, light reflective material particles are added to resin component 1607. In other words, resin component 1607 is light-reflective. For example, resin component 1607 includes a silicone resin or an epoxy resin as a base material in which the light reflective material particles are dispersed.

For example, resin component 1607 has higher hardness in cover portion 253 than in a portion covering side surfaces 180, 182, and 183. With this, it is possible to reduce the deformation of the shape when the temple-bell-shaped structure (outwardly curved surface) of cover portion 253 is formed by applying a resin.

Moreover, for example, cover portion 253 has a width (the direction orthogonal to the extension direction of protrusion 240 in the top view) that gradually decreases as the distance from the maximum width position increases in the positive direction of the Z-axis.

Resin component 1607 includes peripheral portion 234 and protrusion 240.

Peripheral portion 234 is a part of resin component 1607 disposed on mounting surface 170 in contact with side surface 180 of light-emitting element 120, side surface 182 of first light transmissive component 140, and side surface 183 of second light transmissive component 150.

Protrusion 240 is a part of resin component 1607 disposed to protrude from peripheral portion 234 toward a point above topmost surface 191 of light transmissive component 131. It should be noted that in this embodiment, topmost surface 191 of light transmissive component 131 is the top surface (the topmost surface) of second light transmissive component 150.

Protrusion 240 has cover portion 253 that covers the outer edge portion of topmost surface 191 of light transmissive component 131. In other words, cover portion 253 covers the outer edge portion of second light transmissive component 150.

Here, height A1 from mounting surface 170 to the top of cover portion 253 is greater than height A2 from mounting surface 170 to topmost surface 191 of light transmissive component 131. Moreover, in this embodiment, topmost surface 191 is the top surface of second light transmissive component 150.

[Dimension]

Next, the dimension of each component included in light-emitting device 24 according to embodiment 2 will be described.

Figure 43:
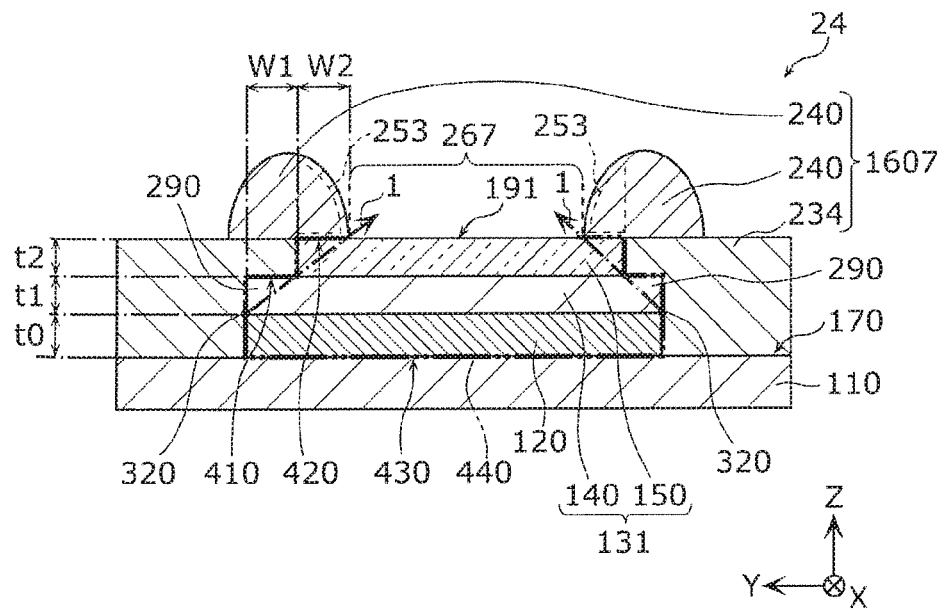
FIG. 43 is a diagram illustrating the dimension of each component included in the light-emitting device according to embodiment 2.

FIG. 43 is a diagram illustrating the dimension of each component included in light-emitting device 24 according to embodiment 2.

It should be noted that a blue component refers to blue light emitted from light-emitting element 120 in light exiting light-emitting device 24, and a yellow component refers to yellow light emitted from phosphor 220 in light transmissive component 131 (in this embodiment, in first light transmissive component 140).

Thickness t0 is the thickness of light-emitting element 120. Thickness t1 is the thickness of first light transmissive component 140. Thickness t2 is the thickness of second light transmissive component 150. Width W1 is the width of a part of first light transmissive component 140 that does not overlap with second light transmissive component 150 in the top view (i.e., the width of non-overlap portion 290). More specifically, width W1 is the width in the direction horizontal to mounting surface 170 in a region of first light transmissive component 140 which is covered by resin component 1607 from the side end of first light transmissive component 140 to the side end of second light transmissive component 150. It should be noted that in this embodiment, first light transmissive component 140 is disposed on light-emitting elements 120 to have a periphery portion which has width W1 and does not overlap with second light transmissive component 150 in the top view. Width W2 is the width of a region in which second light transmissive component 150 is covered by cover portion 253. More specifically, width W2 is the width in the direction horizontal to mounting surface 170 in a region of second light transmissive component 150 which is covered by resin component 1607 from the side end of second light transmissive component 150.

It should be noted that in the following description, the dimensions of thickness t0, thickness t1, thickness t2, width W1, and width W2 may be simply denoted by t0, t1, t2, W1, and W2, respectively.

For example, when the blue light emitted from light-emitting element 120 and the yellow light emitted from first light transmissive component 140 are not lost by reflection at resin component 1607 or the like, the luminance of light emitted by light-emitting device 24 increases with a decrease in exit area (i.e., exposed region 267). Moreover, the luminance of light emitted by light-emitting device 24 increases with an increase in the sum of width W1 and width W2. Moreover, the luminance of light emitted by light-emitting device 24 is independent from the ratio W2/W1.

Here, as the result of a considerable study, the inventors found that when second light transmissive component 150 which is a transparent plate smaller than first light transmissive component 140 in the top view is disposed on first light transmissive component 140 including phosphor 220, the color difference of the mixed light of the blue light and the yellow light which exits from the vicinity of cover portion 253 in exposed region 267 (the difference in chromaticity from the center) decreases with an increase in the ratio W2/W1.

In particular, the inventors found that when $W2 \geq t2/t1 \times W1$ is satisfied, the color difference of light exiting from the vicinity of cover portion 253 in exposed region 267 (the difference in chromaticity between the end and the center of exposed region 267) is small.

With respect to the dimension relationship for components included in light-emitting device 24, the advantageous effect will be qualitatively described below.

It should be noted that in the following description, for the sake of simplifying calculations, it is assumed that light emitted from light-emitting element 120 and first light transmissive component 140 is reflected only in the vertical direction (in this embodiment, in the Z-axis direction). For example, it is assumed that the light emitted from light-emitting element 120 and first light transmissive component 140 is reflected at reflecting surface 440.

In the light transmitting through first light transmissive component 140, light reflected at first reflecting surface 410 which is the interface between first light transmissive component 140 and peripheral portion 234 travels toward the bottom surface (the surface on the negative side of the Z-axis) of light-emitting element 120. The reflected light is further reflected at a reflective electrode (not shown) located in the bottom surface of light-emitting element 120, and transmits through first light transmissive component 140 again and exits from exposed region 267.

It should be noted that when the reflected light transmits through first light transmissive component 140, a part of the blue light included in the reflected light is converted into yellow light.

For example, the mixed light exiting from exposed region 267 after being reflected at resin component 1607 only one time has an optical path passing through first light transmissive component 140 which is three times as long as that of the mixed light exiting from exposed region 267 without ever being reflected at resin component 1607 after the blue light emitted from light-emitting element 120 transmits through first light transmissive component 140.

Accordingly, assuming that the transmission ratio of the blue light transmitting through first light transmissive component 140 is T, the amount of the blue light emitted to the outside of light-emitting device 24, i.e., the blue light existing from exposed region 267, is the cube of T ($T^3$), and all the remaining light is yellow light. In other words, the yellow component increases in the exiting mixed light.

Subsequently, for reviewing the boundary condition in the phenomenon of the luminance increasing with a decrease in exit area, we focus on the length of an optical path along which the blue light passing through lower side end 320 of first light transmissive component 140 travels through first light transmissive component 140 before exiting from exposed region 267.

Here, it should be noted that for the sake of simplification, it is assumed that first light transmissive component 140, second light transmissive component 150, and light-emitting element 120 have the same refractive index. In this case, light travels linearly across the interfaces between them.

As shown in FIG. 43, when W2=t2/t1×W1 is satisfied, the light traveling toward a slightly upper position than the line connecting the end of first light transmissive component 140 and the end of exposed region 267 (the ends in the Y-axis direction) (the line denoted by the dashed-dotted arrow in FIG. 43), which is the blue light passing through lower side end 320 of first light transmissive component 140, is reflected at first reflecting surface 410 and further at third reflecting surface 430, and exits from the end (the end in the Y-axis direction) of exposed region 267 in second light transmissive component 150 (not shown).

On the other hand, the light traveling toward a slightly lower position than the line denoted by the dashed-dotted arrow in FIG. 43 exits directly from the end of exposed region 267 (the end in the Y-axis direction) without being reflected. Hereinafter, the mixed light of these light rays which exits under the condition of W2=t2/t1×W1 is referred to as reference light 1 (light corresponding to the dashed-dotted arrow in FIG. 43).

Here, under the condition that W1+W2 is constant, when width W2 is greater than t2/t1×W1, in FIG. 43, the reflecting surface for the light traveling toward a slightly upper position than the line denoted by the dashed-dotted arrow merely changes from first reflecting surface 410 to second reflecting surface 420. Accordingly, the length of the optical path passing through first light transmissive component 140 of the light traveling toward a slightly upper position than the line denoted by the dashed-dotted arrow is the same as that of reference light 1. The light traveling toward a slightly lower position than reference light 1 exits without being reflected, and thus the optical path length of this light is the same as that of reference light 1. Accordingly, the chromaticity of the mixed light of these light rays is the same as that of reference light 1.

In contrast, when width W2 is smaller than t2/t1×W1, in FIG. 43, the light traveling toward a slightly upper position than the line denoted by the dashed-dotted arrow is still reflected at first reflecting surface 410, and thus the optical path length does not change. However, the light traveling toward a slightly lower position than the line denoted by the dashed-dotted arrow changes to be reflected at first reflecting surface 410. Accordingly, the length of the optical path passing through first light transmissive component 140 of the light traveling toward a slightly lower position than the line denoted by the dashed-dotted arrow is longer than that of reference light 1. With this, the ratio of yellow component to the exiting mixed light is greater than that of reference light 1.

In view of above, the difference in chromaticity of the light exiting from exposed region 267 can be reduced by satisfying W2≥t2/t1×W1.

[Advantageous Effects, Etc.]

As described above, like light-emitting device 10, light-emitting device 24 according to embodiment 2 includes: mounting substrate 110 including mounting surface 170; light-emitting element 120 disposed on mounting surface 170; light transmissive component 131 disposed on light-emitting element 120; and resin component 1607 that covers side surface 180 of light-emitting element 120 and a side surface of light transmissive component 131. Resin component 1607 includes cover portion 253 that covers an outer edge portion of topmost surface 191 of light transmissive component 131. Height A1 from mounting surface 170 to a top of cover portion 253 is greater than height A2 from mounting surface 170 to topmost surface 191 of light transmissive component 131. Topmost surface 191 of light transmissive component 131 includes exposed region 267 that is exposed from resin component 1607.

Moreover, light transmissive component 131 in light-emitting device 24 according to embodiment 2 includes first light transmissive component 140 and second light transmissive component 150 stacked in this order from the mounting surface 170 side. Moreover, in the top view of mounting substrate 110, the outer periphery of second light transmissive component 150 is located inward of the outer periphery of first light transmissive component 140.

Accordingly, light transmissive component 131 has the outer periphery decreased upwardly step by step due to first light transmissive component 140 and second light transmissive component 150 having different areas in the top view. With this, in comparison with the case where only exposed region 267 is downsized, it is possible to reduce the loss of light and improve the luminance of light emitted by light-emitting device 24.

Moreover, for example, first light transmissive component 140 contains phosphor 220.

With this, the type and amount of phosphor 220 are appropriately determined, and thereby it is possible to emit, from light-emitting device 24, desired color light that is mixed light of the light emitted by light-emitting element 120 and the light emitted by phosphor 220. Moreover, light transmissive component 131 has the outer periphery decreased upwardly step by step due to first light transmissive component 140 and second light transmissive component 150 having different areas in the top view, and is surrounded by light reflective resin component 1607. Accordingly, light-emitting device 24 can emit the mixed light focusing on a narrow region. With this, it is possible to improve the luminance of light emitted by light-emitting device 24.

Moreover, for example, second light transmissive component 150 does not contain phosphor 220. Moreover, for example, W2≥t2/t1×W1 is satisfied, where t1 is the thickness of first light transmissive component 140, W1 is the width of a region of first light transmissive component 140 covered by resin component 1607 from the side end of first light transmissive component 140 to the side end of second light transmissive component 150, t2 is the thickness of second light transmissive component 150, and W2 is the width of a region of second light transmissive component 150 covered by resin component 1607 from the side end of second light transmissive component 150, both of the widths being in a direction horizontal to mounting surface 170.

With this, for example, in comparison with light exiting from the center of exposed region 267, it is possible to prevent an increase in the yellow component of light exiting from the end of exposed region 267. Accordingly, it is possible to reduce the variation in the distribution of the chromaticity of light emitted by light-emitting device 25.

Embodiment 3

Next, a light-emitting device according to embodiment 3 will be described. It should be noted that in the description of the light-emitting device according to embodiment 3, the components substantially identical to those of the light-emitting devices according to embodiment 1, variations of embodiment 1, and embodiment 2 are assigned the same reference signs, and overlapping descriptions thereof may be omitted or simplified.

[Configuration]

Figure 44:
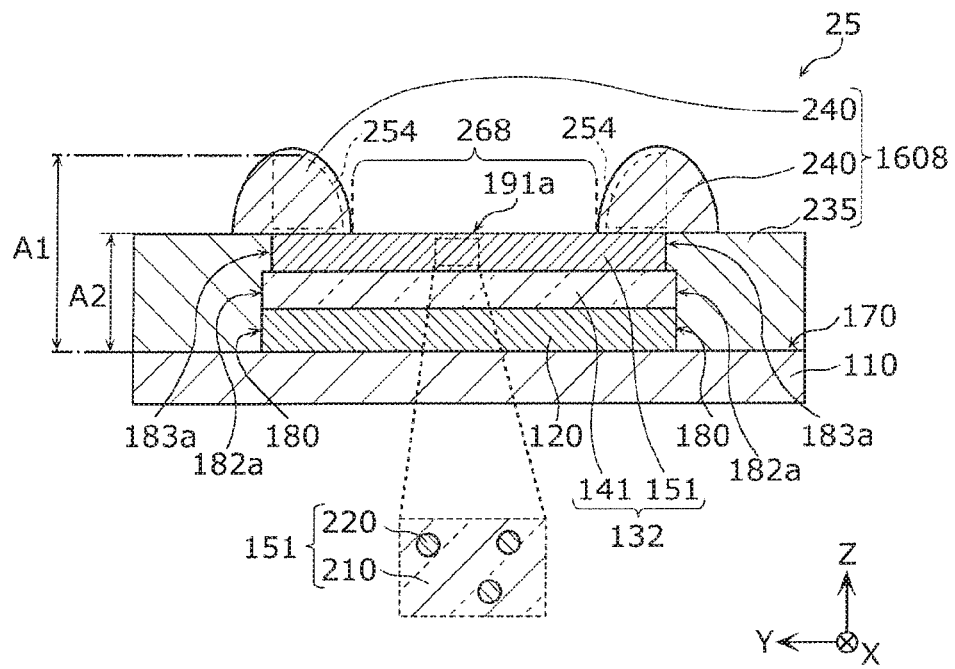
FIG. 44 is a sectional view of a light-emitting device according to embodiment 3.

FIG. 44 is a sectional view of light-emitting device 25 according to embodiment 3. It should be noted that the sectional view shown in FIG. 44 corresponds to the sectional view of FIG. 2. For example, the top view of light-emitting device 25 is the same as that of light-emitting device 10 shown in (a) of FIG. 1.

As shown in FIG. 44, light-emitting device 25 includes mounting substrate 110, light-emitting elements 120, light transmissive component 132, and resin component 1608.

Light transmissive component 132 transmits light emitted by light-emitting element 120. In this embodiment, light transmissive component 132 includes first light transmissive component 141 and second light transmissive component 151.

First light transmissive component 141 and second light transmissive component 151 are each a component that transmits light emitted by light-emitting element 120.

Moreover, in this embodiment, first light transmissive component 141 and second light transmissive component 151 are each rectangular plate-shaped in the top view. Moreover, in the top view of mounting substrate 110, the outer periphery of second light transmissive component 151 is located inward of the outer periphery of first light transmissive component 141. In this embodiment, first light transmissive component 141 and light-emitting element 120 have substantially the same shape and size in the top view, and are disposed such that their outer edges overlap with each other.

It should be noted that the shapes of first light transmissive component 141 and second light transmissive component 151 in the top view are not particularly limited.

Moreover, first light transmissive component 141 is bonded to the top surface of light-emitting element 120. Moreover, second light transmissive component 151 is bonded to the top surface of first light transmissive component 141. In other words, light transmissive component 132 includes first light transmissive component 141 and second light transmissive component 151 stacked in this order from the mounting surface 170 side.

First light transmissive component 141 does not contain phosphor 220, and is made of a transmissive resin material (e.g., the same material as binder 210), a glass, a ceramic, or the like. In this embodiment, first light transmissive component 141 is a glass.

On the other hands, second light transmissive component 151 contains phosphor 220. More specifically, second light transmissive component 151 includes binder 210 and phosphor 220, for example. Accordingly, second light transmissive component 151 emits fluorescence light using a part of light emitted by light-emitting element 120 as excitation light. Thus, in this embodiment, second light transmissive component 151 (more specifically, phosphor 220 contained in second light transmissive component 151) emits yellow light (yellow fluorescence light) using the blue light emitted by light-emitting element 120 as excitation light.

Resin component 1608 surrounds light-emitting elements 120 and light transmissive component 132. In particular, resin component 1608 is disposed in contact with light-emitting elements 120 and light transmissive component 132. More specifically, resin component 1608 is disposed on mounting surface 170 in contact with side surface 180 of light-emitting element 120, side surface 182a of first light transmissive component 141, and side surface 183a of second light transmissive component 151.

A silicone resin, an epoxy resin, or the like is taken as an example of resin component 1608.

Moreover, in this embodiment, light reflective material particles are added to resin component 1608. In other words, resin component 1608 is light-reflective. For example, resin component 1608 includes a silicone resin or an epoxy resin as a base material in which the light reflective material particles are dispersed.

For example, resin component 1608 has higher hardness in covering portion 254 than in a portion covering side surfaces 180, 182a, and 183a. With this, it is possible to reduce the deformation of the shape when the temple-bell-shaped structure (outwardly curved surface) of cover portion 254 is formed by applying a resin.

Moreover, for example, cover portion 254 has a width (the direction orthogonal to the extension direction of protrusion 240 in the top view) that gradually decreases as the distance from the maximum width position increases in the positive direction of the Z-axis.

Resin component 1608 includes peripheral portion 235 and protrusion 240.

Peripheral portion 235 is a part of resin component 1608 disposed on mounting surface 170 in contact with side surface 180 of light-emitting element 120, side surface 182a of first light transmissive component 141, and side surface 183a of second light transmissive component 151.

Protrusion 240 is a part of resin component 1608 disposed to protrude from peripheral portion 235 toward a point above topmost surface 191a of light transmissive component 132. It should be noted that in this embodiment, topmost surface 191a of light transmissive component 132 is the top surface (the topmost surface) of second light transmissive component 151.

Protrusion 240 has cover portion 254 that covers the outer edge portion of topmost surface 191a of light transmissive component 132. In other words, cover portion 254 covers the outer edge portion of second light transmissive component 151.

Here, height A1 from mounting surface 170 to the top of cover portion 254 is greater than height A2 from mounting surface 170 to topmost surface 191a of light transmissive component 132. In this embodiment, topmost surface 191a is the top surface of second light transmissive component 151. Moreover, in this embodiment, height A1 is to the top of protrusion 240.

[Dimension]

Next, the dimension of each component included in light-emitting device 25 according to embodiment 3 will be described.

Figure 45:
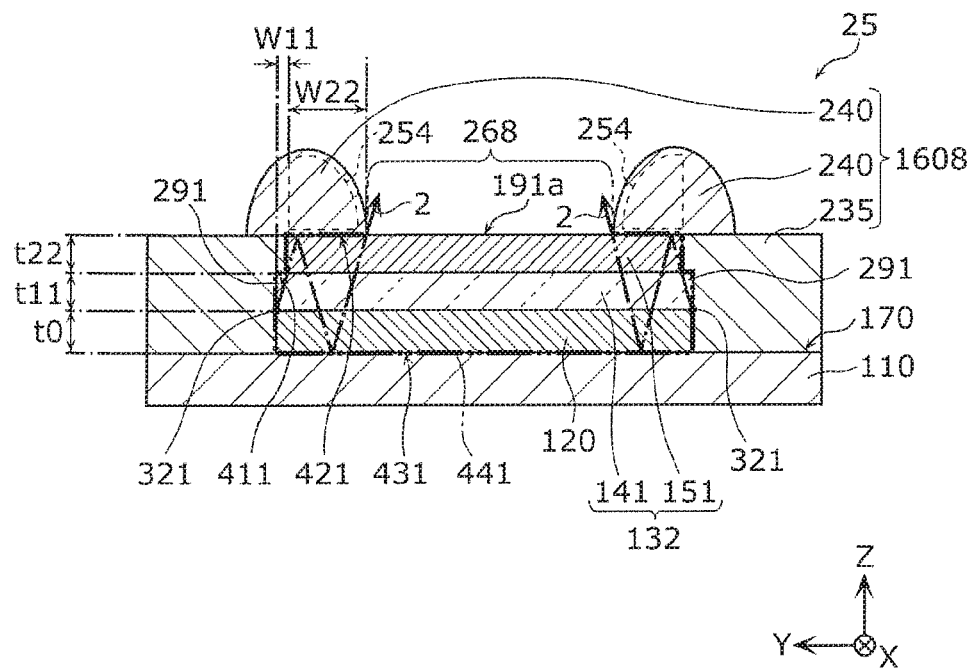
FIG. 45 is a diagram illustrating the dimension of each component included in the light-emitting device according to embodiment 3.

FIG. 45 is a diagram illustrating the dimension of each component included in light-emitting device 25 according to embodiment 3.

Thickness t0 is the thickness of light-emitting element 120. Thickness t11 is the thickness of first light transmissive component 141. Thickness t22 is the thickness of second light transmissive component 151. Width W11 is the width of a part of first light transmissive component 141 that does not overlap with second light transmissive component 151 in the top view (i.e., the width of non-overlap portion 291). More specifically, width W11 is the width in the direction horizontal to mounting surface 170 in a region of first light transmissive component 141 which is covered by resin component 1608 from the side end of first light transmissive component 141 to the side end of second light transmissive component 151. It should be noted that in this embodiment, first light transmissive component 141 is disposed on light-emitting elements 120 to have a periphery portion which has width W11 and does not overlap with second light transmissive component 151 in the top view.

Width W22 is the width of a region in which second light transmissive component 151 is covered by cover portion 254. More specifically, width W22 is the width in the direction horizontal to mounting surface 170 in a region of second light transmissive component 151 which is covered by resin component 1608 from the side end of second light transmissive component 151.

It should be noted that in the following description, the dimensions of thickness t0, thickness t11, thickness t22, width W11, and width W22 may be simply denoted by t0, t11, t22, W11, and W22, respectively.

Like light-emitting device 24 according to embodiment 2, for example, when the blue light emitted from light-emitting element 120 and the yellow light emitted from second light transmissive component 151 are not lost by reflection at resin component 1608 or the like, the luminance of light emitted by light-emitting device 25 increases with a decrease in exit area (i.e., exposed region 268). Moreover, the luminance of light emitted by light-emitting device 25 increases with an increase in the sum of width W11 and width W22. Moreover, the luminance of light emitted by light-emitting device 25 is independent from the ratio W22/W11.

Here, as the result of a considerable study, the inventors found that when second light transmissive component 151 which is a plate including phosphor 220 and smaller than first light transmissive component 141 in the top view is disposed on first light transmissive component 141 which is a transparent plate, the color difference of the mixed light of the blue light and the yellow light which exits from the vicinity of cover portion 254 in exposed region 268 (the difference in chromaticity from the center) decreases with a decrease in the ratio W22/W11.

In particular, the inventors found that when $W22 \leq (2 \times t0 + 2 \times t11 + 3 \times t22)/t11 \times W11$ is satisfied, the color difference of light exiting from the vicinity of cover portion 254 in exposed region 268 (the difference in chromaticity between the end and the center of exposed region 268) is small.

With respect to the dimension relationship for components included in light-emitting device 25, the advantageous effect will be qualitatively described below.

It should be noted that in the following description, for the sake of simplifying calculations, it is assumed that the light emitted from light-emitting element 120 and second light transmissive component 151 is reflected only in the vertical direction (in this embodiment, in the Z-axis direction). For example, it is assumed that the light emitted from light-emitting element 120 and second light transmissive component 151 is reflected at reflecting surface 441.

Here, for reviewing the boundary condition in the phenomenon of the luminance increasing with a decrease in exit area, we focus on the length of an optical path along which the blue light passing through lower side end 321 of first light transmissive component 141 travels through first light transmissive component 141 before exiting from exposed region 268.

It should be noted here that for the sake of simplification, it is assumed that first light transmissive component 141, second light transmissive component 151, and light-emitting element 120 have the same refractive index. In this case, light travels linearly across the interfaces between them.

As shown in FIG. 45, when $W22=(2 \times t0+2 \times t11+3 \times t22)/t11 \times W11$ is satisfied, the light traveling toward a slightly upper position than the line connecting the end of first light transmissive component 141 and the end of second light transmissive component 151 (the ends in the Y-axis direction) (the line denoted by the dashed-dotted arrow in FIG. 45), which is the blue light passing through lower side end 321 of first light transmissive component 141, is reflected at the interface between peripheral portion 235 and the top surface of first light transmissive component 141 (first reflecting surface 411) and further at third reflecting surface 431. The reflected light travels through second light transmissive component 151 and is reflected at the interface between second light transmissive component 151 and cover portion 254 (second reflecting surface 421) and further reflected at third reflecting surface 431 again before exiting from exposed region 268. Accordingly, this light travels through second light transmissive component 151 including phosphor 220, three times.

On the other hand, the light traveling toward a lower position than the line denoted by the dashed-dotted arrow in FIG. 45 is reflected at second reflecting surface 421 and further at third reflecting surface 431, and exits from exposed region 268. Accordingly, this light travels through second light transmissive component 151 including phosphor 220, three times.

Hereinafter, the mixed light of these reflected light rays which exits under the condition of $W22=(2 \times t0+2 \times t11+3 \times t22)/t11 \times W11$ is referred to as reference light 2.

Here, under the condition that W11+W22 is constant, when width W22 is greater than $(2 \times t0+2 \times t11+3 \times t22)/t11 \times W11$, in FIG. 45, the light traveling toward an upper position than the line denoted by the dashed-dotted arrow is reflected at not first reflecting surface 411 but second reflecting surface 421 after traveling through second light transmissive component 151. The reflected light is further reflected at third reflecting surface 431, second reflecting surface 421, and third reflecting surface 431 in this order, and exits from exposed region 268. Accordingly, this light travels through second light transmissive component 151 five times, and thus the optical path length of this light is longer than that of reference light 2.

Moreover, in FIG. 45, the light traveling toward a lower position than the line denoted by the dashed-dotted arrow is reflected at second reflecting surface 421 and further at third reflecting surface 431, and exits from exposed region 268, and thus this light travels through second light transmissive component 151 three times. Accordingly, the optical path length of this light is the same as that of reference light 2. Accordingly, the yellow component in the chromaticity of the mixed light of these reflected light rays is greater than that of reference light 2.

In contrast, when width W22 is smaller than (2×t0+2×t11+3×t22)/t11×W11, in FIG. 45, the light traveling toward an upper position than the line denoted by the dashed-dotted arrow is still reflected at first reflecting surface 411, third reflecting surface 431, second reflecting surface 421, and third reflecting surface 431 in this order, and exits from exposed region 268. Accordingly, this light travels through second light transmissive component 151 three times, and thus the optical path length of this light is the same as that of reference light 2.

Moreover, the light traveling toward a lower position than the line denoted by the dashed-dotted arrow in FIG. 45 is reflected at second reflecting surface 421 and further at third reflecting surface 431, and exits from exposed region 268, and thus this light travels through second light transmissive component 151 three times. Accordingly, the optical path length of this light is the same as that of reference light 2. Accordingly, the chromaticity of the mixed light of these reflected light rays is the same as that of reference light 2.

In view of above, the difference in chromaticity of the light exiting from exposed region 268 can be reduced by satisfying W22≤(2×t0+2×t11+3×t22)/t11×W11.

[Advantageous Effects, Etc.]

As described above, like light-emitting device 24, light-emitting device 25 according to embodiment 3 includes: mounting substrate 110 including mounting surface 170; light-emitting element 120 disposed on mounting surface 170; light transmissive component 132 disposed on light-emitting element 120; and resin component 1608 that covers side surface 180 of light-emitting element 120 and a side surface of light transmissive component 132. Resin component 1608 includes cover portion 254 that covers an outer edge portion of topmost surface 191a of light transmissive component 131. Height A1 from mounting surface 170 to a top of cover portion 254 is greater than height A2 from mounting surface 170 to topmost surface 191a of light transmissive component 132. Topmost surface 191a of light transmissive component 132 includes exposed region 268 that is exposed from resin component 1608. Moreover, light transmissive component 132 in light-emitting device 25 according to embodiment 3 includes first light transmissive component 141 and second light transmissive component 151 stacked in the stated order from mounting surface 170 side. In the top view of mounting substrate 110, the outer periphery of second light transmissive component 151 is located inward of the outer periphery of first light transmissive component 141.

Moreover, second light transmissive component 151 in light-emitting device 25 contains phosphor 220.

With this, among first light transmissive component 141 and second light transmissive component 151, second light transmissive component 151 having exposed region 268 through which light inside light-emitting device 25 exits to the outside contains phosphor 220, and resin component 1608 covers side surface 182a of first light transmissive component 141 located on the light-emitting element 120 side. In this manner, it is possible to cause light before the light emitted by light-emitting element 120 is wavelength-converted by phosphor 220 (i.e., excitation light) to focus on a narrow region. Accordingly, it is possible to improve the luminance of light emitted by light-emitting device 25.

Moreover, for example, first light transmissive component 141 does not contain phosphor 220. Moreover, for example, W22≤(2×t0+2×t11+3×t22)/t11×W11 is satisfied, where t0 is the thickness of light-emitting element 120, t11 is the thickness of first light transmissive component 141, W11 is the width of a region of first light transmissive component 141 covered by resin component 1608 from the side end of first light transmissive component 141 to the side end of second light transmissive component 151, t22 is the thickness of second light transmissive component 151, and W22 is the width of a region of second light transmissive component 151 covered with resin component 1608 from the side end of second light transmissive component 151, both of the widths being in a direction horizontal to mounting surface 170.

With this, for example, in comparison with light exiting from the center of exposed region 268, it is possible to prevent an increase in the yellow component of light exiting from the end of exposed region 268. Accordingly, it is possible to reduce the variation in the distribution of the chromaticity of light emitted by light-emitting device 25.

Other Embodiments

The light-emitting devices according to embodiments and variations of the present disclosure have been described above based on the embodiments and variations above. However, the present disclosure is not limited to the above embodiments and variations.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to a light-emitting device including a light-emitting element flip-chip mounted to a mounting substrate, for example.

The invention claimed is:

1. A light-emitting device, comprising:
a mounting substrate including a mounting surface;
a light-emitting element disposed on the mounting surface;
a light transmissive component disposed on the light-emitting element; and
a resin component that covers a side surface of the light-emitting element and a side surface of the light transmissive component, wherein
the resin component includes a cover portion that directly contacts and covers an outer edge portion of a topmost surface of the light transmissive component and directly contacts and covers a portion of the topmost surface of the light transmissive component,
a height from the mounting surface to a top of the cover portion is greater than a height from the mounting surface to the topmost surface of the light transmissive component,
the topmost surface of the light transmissive component includes an exposed region that is exposed from the resin component so as to form a portion of a topmost surface of the light-emitting device, and the cover portion is disposed continuously along one side of the light transmissive component.

2. The light-emitting device according to claim 1, wherein the cover portion covers at least 5% of an area of the topmost surface of the light transmissive component.

3. The light-emitting device according to claim 1, wherein in the resin component, the cover portion and a part covering the side surface of the light transmissive component are integrally formed.

4. The light-emitting device according to claim 1, wherein the resin component is a reflective material, and the cover portion includes an outwardly curved surface located close to the exposed region.

5. The light-emitting; device according to claim 1, wherein the cover portion is a part of a projected portion disposed on the light transmissive component, and a width of the projected portion is constant throughout the cover portion extending linearly in a top view.

6. The light-emitting device according to claim 1, wherein in the exposed region, a slope of a luminance distribution changes such that a luminance increases as a distance to the cover portion decreases, the luminance distributionbeing in a direction vertical to the cover portion disposed continuously along the one side of the light transmissive component.

7. The light-emitting device according to claim 1, wherein the light-emitting element comprises a plurality of light-emitting elements disposed between the light transmissive component and the mounting substrate.

8. The light-emitting device according to claim 1, wherein the resin component includes a peripheral portion that covers the side surface of the light-emitting element and the side surface of the light transmissive component, and a protrusion that protrudes upwardly from the peripheral portion and includes the cover portion, the protrusion is linear in a top view, and an end of the protrusion is disposed inward of an outer end of the peripheral portion in the top view.

9. The light-emitting device according to claim 1, wherein the exposed region of the light transmissive component is exposed to air.

10. The light-emitting device according to claim 1, wherein the light transmissive component is rectangular-shaped in a top view, an exposed width of the exposed region changes along one side of the light transmissive component, a covered region of the light transmissive component covered by the cover portion has a different cover width along the one side of the light transmissive component in the top view, and in two parallel sectional views across the light transmissive component, when a first exposed width in a first sectional view is greater than a second exposed width in a second sectional view, a first cover width in the first sectional view is smaller than a second cover width in the second sectional view.

11. The light-emitting device according to claim 10, wherein in the exposed region, a luminance in a position corresponding to the second exposed width is higher than a luminance in a position corresponding to the first exposed width.

12. The light-emitting device according to claim 1, wherein the resin component includes a peripheral portion that covers the side surface of the light-emitting element and the side surface of the light transmissive component, and a protrusion that protrudes upwardly from the peripheral portion and includes the cover portion, and in a top view, an end of the protrusion is aligned with ari outer end of the peripheral portion.

13. The light-emitting device according to claim 12, wherein in the top view, three sides of the protrusion are each aligned with the outer end of the peripheral portion.

14. The light-emitting device according to claim 1, wherein the exposed region is substantially trapezoidal-shaped.

15. The light-emitting device according to claim 14, wherein the transmissive component is rectangular-shaped in a top view.

16. The light-emitting device according to claim 15, wherein in the exposed region, a luminance in a region close to a short side of the substantially trapezoidal shape is higher than a luminance in a region close to a long side of the substantially trapezoidal shape, the short side being opposite the long side.

17. The light-emitting device according to claim 1, wherein the light transmissive component includes a first light transmissive component and a second light transmissive component stacked in the stated order from a mounting surface side, and in a top view of the mounting substrate, an outer periphery of the second light transmissive component is located inward of an outer periphery of the first light transmissive component.

18. The light-emitting device according to claim 17, wherein the first light transmissive component contains a phosphor.

19. The light-emitting device according to claim 18, wherein the second light transmissive component does not contain a phosphor, and $W2 \geq t2/t1 \times W1$ is satisfied, where t1 is a thickness of the first light transmissive component, W1 is a width of a region of the first light transmissive component covered by the resin component from a side end of the first light transmissive component to a side end of the second light transmissive component, t2 is a thickness of the second light transmissive component, and W2 is a width of a region of the second light transmissive component covered by the resin component from the side end of the second light transmissive component, both of the widths being in a direction horizontal to the mounting surface.

20. The light-emitting device according to claim 17, wherein the second light transmissive component contains a phosphor.

21. The light-emitting device according to claim 20, wherein the first light transmissive component does not contain a phosphor, and $W22 \leq (2 \times t0 + 2 \times t11 + 3 \times t22)/t11 \times W11$ is satisfied, where t0 is a thickness of the light-emitting element, t11 is a thickness of the first light transmissive component, W11 is a width of a region of the first light transmissive component covered by the resin component from a side end of the first light transmissive component to a side end of the second light transmissive component, $t_{22}$ is a thickness of the second light transmissive component, and $W_{22}$ is a width of a region of the second light transmissive component covered with the resin component from the side end of the second light transmissive component, both of the widths being in a direction horizontal to the mounting surface.

* * * * *